United States Patent
Do et al.

(10) Patent No.: US 9,496,179 B2
(45) Date of Patent: Nov. 15, 2016

(54) METHOD OF MANUFACTURING SEMICONDUCTOR DEVICES

(71) Applicant: SAMSUNG ELECTRONICS CO., LTD., Suwon-Si, Gyeonggi-Do (KR)

(72) Inventors: Jung-Ho Do, Yongin-Si (KR); Sanghoon Baek, Seoul (KR); Sunyoung Park, Seoul (KR); Sang-Kyu Oh, Gwacheon-Si (KR); Jintae Kim, Suwon-Si (KR); Hyosig Won, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/833,922

(22) Filed: Aug. 24, 2015

(65) Prior Publication Data
US 2016/0056083 A1 Feb. 25, 2016

Related U.S. Application Data

(60) Provisional application No. 62/041,560, filed on Aug. 25, 2014.

(30) Foreign Application Priority Data

Dec. 8, 2014 (KR) .......................... 10-2014-0175047

(51) Int. Cl.
| | |
|---|---|
| *H01L 21/768* | (2006.01) |
| *H01L 21/8234* | (2006.01) |
| *H01L 21/027* | (2006.01) |
| *H01L 21/321* | (2006.01) |

(52) U.S. Cl.
CPC ... *H01L 21/823475* (2013.01); *H01L 21/0274* (2013.01); *H01L 21/32115* (2013.01); *H01L 21/76802* (2013.01); *H01L 21/76877* (2013.01); *H01L 21/823418* (2013.01); *H01L 21/823431* (2013.01); *H01L 21/823437* (2013.01)

(58) Field of Classification Search
CPC ................... H01L 21/70; H01L 21/702; H01L 21/71; H01L 21/8232
See application file for complete search history.

(56) References Cited

U.S. PATENT DOCUMENTS

| | | | |
|---|---|---|---|
| 6,964,584 | B2 | 11/2005 | Zhong et al. |
| 7,129,562 | B1 | 10/2006 | Gheewala et al. |
| 8,255,837 | B2 | 8/2012 | Lu et al. |

(Continued)

FOREIGN PATENT DOCUMENTS

| | | |
|---|---|---|
| JP | 2009-224648 | 10/2009 |
| JP | 2010-067683 | 3/2010 |
| KR | 1020110097886 | 8/2011 |

*Primary Examiner* — Cheung Lee
(74) *Attorney, Agent, or Firm* — Volentine & Whitt, PLLC

(57) ABSTRACT

A method of manufacturing a semiconductor device includes forming an active pattern and a gate electrode crossing the active pattern on a substrate, forming a first contact connected to the active pattern at a side of the gate electrode, forming a second contact connected to the gate electrode, and forming a third contact connected to the first contact at the side of the gate electrode. The third contact is formed using a photomask different from that used to form the first contact. A bottom surface of the third contact is disposed at a level in the device lower than the level of a top surface of the first contact.

12 Claims, 46 Drawing Sheets

(56) References Cited

U.S. PATENT DOCUMENTS

| | | | |
|---|---|---|---|
| 8,368,225 | B2 | 2/2013 | Ikegami et al. |
| 8,507,957 | B2 | 8/2013 | Hou et al. |
| 8,584,052 | B2 | 11/2013 | Chen et al. |
| 8,598,633 | B2 | 12/2013 | Tarabbia et al. |
| 8,661,392 | B2 | 2/2014 | Quandt et al. |
| 8,677,291 | B1 | 3/2014 | Yuan et al. |
| 8,698,273 | B2 | 4/2014 | Ikegami et al. |
| 8,732,641 | B1 | 5/2014 | Yuh et al. |
| 8,791,509 | B2 | 7/2014 | Beyer et al. |
| 2010/0148155 | A1* | 6/2010 | Choi ................ H01L 29/78606 257/40 |
| 2012/0098073 | A1* | 4/2012 | Yu .................... H01L 21/76802 257/413 |
| 2014/0182877 | A1 | 7/2014 | Jolly |

\* cited by examiner

METHOD OF MANUFACTURING SEMICONDUCTOR DEVICES

PRIORITY STATEMENT

This U.S. non-provisional patent application claims priority under 35 U.S.C. §119 from U.S. Provisional Patent application Ser. No. 62/041,560, filed on Aug. 25, 2014, and Korean Patent Application No. 10-2014-0175047, filed on Dec. 8, 2014, the entire contents of which are hereby incorporated by reference.

BACKGROUND

The inventive concept relates to a semiconductor device and to a manufacturing method thereof. More particularly, the inventive concept relates to a semiconductor device including a plurality of standard cells and to a manufacturing method thereof.

Semiconductor devices are in the spotlight as important factors in miniaturizing, increasing the number of functions of and/or lower the manufacturing cost of products throughout the electronics industry. Semiconductor devices may be classified into semiconductor memory devices that store data, semiconductor logic devices that process data, and hybrid semiconductor devices including a memory element and a logic element. Developments in the electronics industry create a demand for improved semiconductor devices. For example, demands for semiconductor devices that offer higher reliability, operate at higher speeds and/or can perform greater numbers of functions are constantly increasing. To satisfy these demands, the architecture and elements of semiconductor device must become more complex and semiconductor devices must also become more highly integrated.

SUMMARY

A representative embodiment of a method of manufacturing a semiconductor device, according to the inventive concept, includes forming a gate electrode crossing an active pattern of a substrate, forming a first contact electrically connected to the active pattern at one side of the gate electrode, forming a second contact connected to the gate electrode, and forming a third contact electrically connected to the first contact at the side of the gate electrode. Also, the forming of the first contact comprises performing an exposure process using one photomask, the forming of the third contact comprises performing an exposure process using a photomask different from said one photomask, and the third contact is formed such that a bottom surface of the third contact is disposed at a level in the device that is lower than that at which a top surface of the first contact is disposed.

Another representative embodiment of a method of manufacturing a semiconductor device, according to the inventive concept, includes forming an interlayer insulating layer on a substrate, performing a photolithography process using a first photomask to form first contact holes through the interlayer insulating layer, performing a photolithography process using a second photomask to form a second contact hole in the interlayer insulating layer extending to at least one of the first contact holes, and forming first contacts and a second contact in the first contact holes and the second contact hole, respectively, such that at least one of the first contacts formed in the first contact holes is electrically connected to the second contact formed in the second contact hole, and such that a bottom surface of the second contact is disposed at a level in the device that is lower than that at which a top surface of each of the first contacts is disposed.

Still another representative embodiment of a method of manufacturing a semiconductor device, according to the inventive concept, includes forming linear active semiconductor patterns extending longitudinally in a first direction, forming a linear gate electrode extending longitudinally across the active patterns in a second direction, forming source/drain regions in or adjacent the active patterns, forming an insulating layer over the active patterns, performing a first selective etch process comprising etching the insulating layer to concurrently form first contact holes in the insulating layer on one of the sides of the gate electrode, the first contact holes extending through the insulating layer as separated from each other along the second direction, and each of the first contact holes exposing a plurality of respective ones of the active patterns, subsequently performing a second selective etch process comprising etching a portion of the insulating layer remaining after the first selective etch process to expand at least one of the first contact holes in the second direction, forming conductive material in the first contact holes and in the expanded portion of the at least one of the first contact holes formed by the second etch process, and forming a via on said portion of conductive material located in the expanded portion of said at least one of the first contact holes. Also, in this representative embodiment, a plurality of the source/drain regions wind up being formed on each of opposite sides of the gate electrode, and the conductive material is formed in the first contact holes as electrically connected to a plurality of the source/drain regions.

BRIEF DESCRIPTION OF THE DRAWINGS

Preferred embodiments of the inventive concept will be described below in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers designate like elements throughout the drawings.

FIGS. 2A through 6D illustrate a method of manufacturing a semiconductor device in accordance with a first embodiment of the inventive concept, wherein:

FIGS. 2A, 3A, 4A, 5A and 6A are each a plan view of the device during the course of its manufacture;

FIG. 7A through 7D illustrate a method of manufacturing a semiconductor device in accordance with a modified example of the first embodiment of the inventive concept, wherein:

FIG. 7A is a plan view of the device during the course of its manufacture; and

FIGS. 7B, 7C and 7D are cross-sectional views taken along lines I-I', II-II' and III-III' of FIG. 7A, respectively.

FIGS. 8A through 10D illustrate a method of manufacturing a semiconductor device in accordance with a second embodiment of the inventive concept, wherein:

FIGS. 8A, 9A and 10A are each a plan view of the device during the course of its manufacture;

FIGS. 8D, 9D and 10D are cross-sectional views taken along lines III-III' of FIGS. 8A through 10A, respectively.

FIG. 11A through 11D illustrate a method of manufacturing a semiconductor device in accordance with a modified example of the second embodiment of the inventive concept, wherein:

FIG. 11A is a plan view of the device during the course of its manufacture; and

FIGS. 11B, 11C and 11D are cross-sectional views taken along lines I-I', II-II' and III-III' of FIG. 11A, respectively.

FIGS. 12A through 14D illustrate a method of a semiconductor device in accordance with a third embodiment according to the inventive concept, wherein:

FIG. 12A is a plan view of the device during the course of its manufacture;

FIGS. 12D, 13D and 14D are cross-sectional views taken along lines III-III' of FIGS. 12A through 14A, respectively.

FIG. 15A through 15D illustrate another example of a method of manufacturing a semiconductor device in accordance with a modified example of the third embodiment of the inventive concept, wherein:

FIG. 15A is a plan view of the device during the course of its manufacture; and

FIGS. 15B, 15C and 15D are cross-sectional views taken along lines I-I', II-II' and III-III' of FIG. 15A, respectively.

DETAILED DESCRIPTION OF PREFERRED EMBODIMENTS

Figure 1:
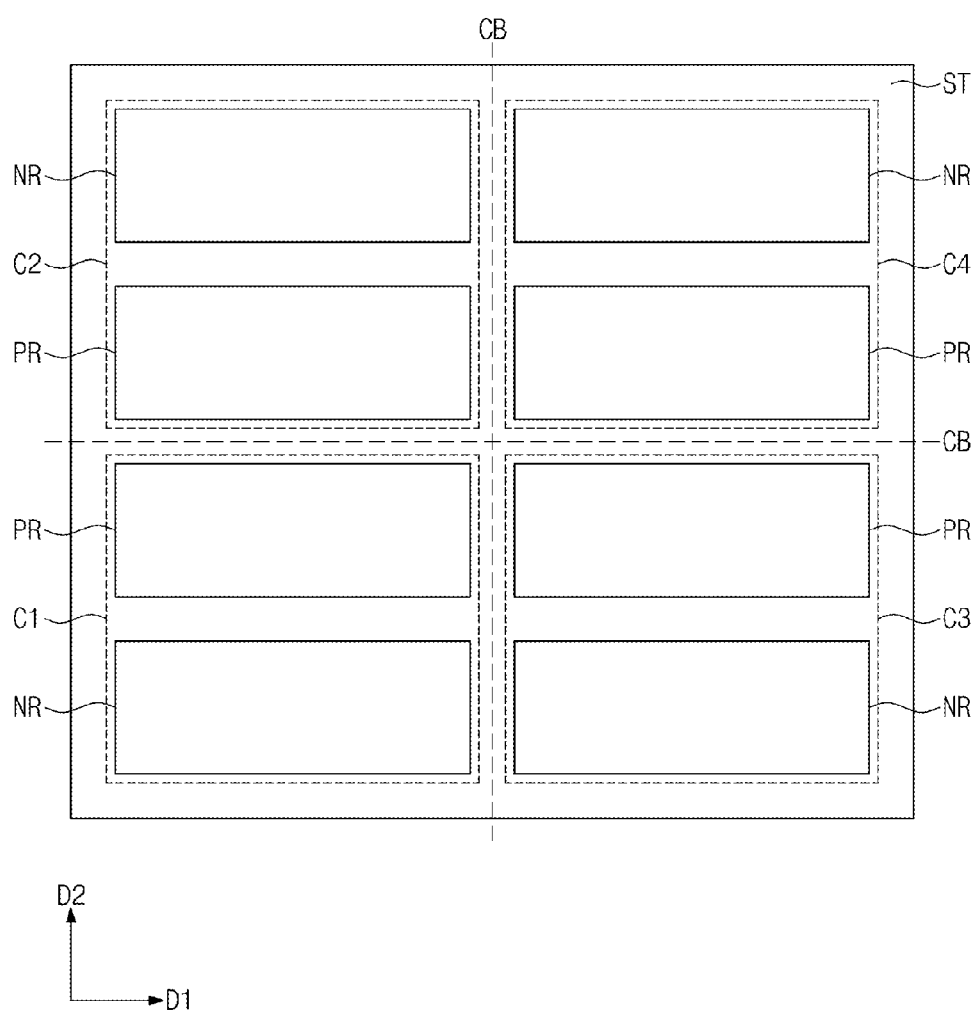
FIG. 1 is a plan view of a semiconductor device which may be made in accordance with representative embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will also be understood that when an element such as a layer, region or substrate is referred to as being "on" or "onto" another element, it may lie directly on the other element or intervening elements or layers may also be present.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Also, the order in which process steps are described is not in and of itself limiting. That is, unless the description states otherwise or the context makes clear, process steps that are described one after the other may be performed concurrently or in sequence other than the sequence in which the descriptions of the steps appear. Likewise, unless certain steps are described as being carried out concurrently, the steps may be performed sequentially.

Other terminology will be given its plain and customary meaning within the art. For example, a "photolithography process" will be generally understood as a process that includes the forming of a layer of photoresist on a target layer or substrate, an exposure process of exposing the photoresist layer to light through a mask (referred to generally as a "photomask") bearing a mask pattern to transfer an image of the mask pattern to the photoresist layer, and a developing process in which the exposed (or unexposed) part of the photoresist layer is removed thereby patterning the photoresist layer. Then, in the photolithography process, the photoresist pattern is used an etch mask to selectively etch the underlying target layer or substrate, thereby transcribing an image of the mask pattern onto the substrate.

FIG. 1 is a plan view of a semiconductor device in accordance with representative embodiments of the inventive concept.

Referring to FIG. 1, the semiconductor device may include a plurality of logic cells C1, C2, C3 and C4 provided on a substrate. Each of the logic cells C1, C2, C3 and C4 may include a plurality of transistors. The semiconductor device may include a first logic cell C1, a third logic cell C3 spaced apart from the first logic cell C1 in a first direction D1, a second logic cell C2 spaced apart from the first logic cell C1 in a second direction D2 crossing the first direction D1 and a fourth logic cell C4 spaced apart from the third logic cell C3 in the second direction D2. The fourth logic cell C4 may be spaced apart from the second logic cell C2 in the first direction D1. A cell boundary CB may be defined between the adjacent logic cells C1, C2, C3 and C4.

Each of the logic cells C1, C2, C3 and C4 may include active regions separated by a device isolation layer ST. Each of the logic cells C1, C2, C3 and C4 may include a PMOSFET region PR and an NMOSFET region NR. The PMOSFET region PR and the NMOSFET region NR of each of the logic cells C1, C2, C3 and C4 may be separated by the device isolation layer ST.

The PMOSFET region PR and the NMOSFET region NR may be spaced apart from each other in the second direction D2. The PMOSFET region PR of the first logic cell C1 may be adjacent to the PMOSFET region PR of the second logic cell C2 in the second direction D2. In the present specification, the term "logic cell" may refer to a unit for performing one Boolean logic function (e.g., an INVERTER, AND, OR, NAND, NOR, etc.) or one storage function (e.g., a FLIP-FLOP). Four logic cells are illustrated but a semiconductor device according to the inventive concept is not limited to having only four logic cells.

Figure 19:
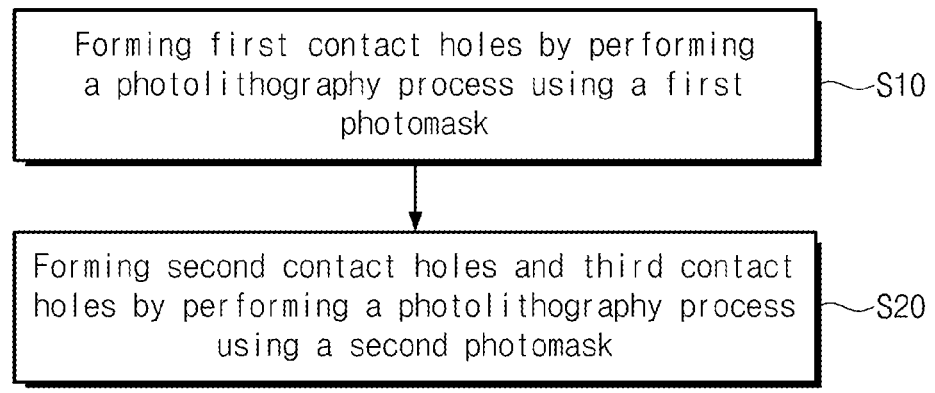
FIG. 19 is a flowchart illustrating a method of forming first through third contact holes in accordance with some embodiments according to the inventive concept.

A method of manufacturing a semiconductor device in accordance with a first embodiment of the inventive concept is shown in FIGS. 2A-6D. The method will be described based mainly on the manufacturing of the first logic cell C1 but the remaining logic cells C2, C3 and C4 may have structures similar to the first logic cell C1 and so are manufactured using similar processes. FIG. 19 is a flowchart illustrating a method of forming first through third contact holes in accordance with some embodiments according to the inventive concept.

Referring to FIGS. 1 and 2A through 2D, a device isolation layer ST or simply "device isolation" may be formed in a substrate 100 to define an active region. The substrate 100 may be a silicon substrate, a germanium substrate, or a SOI (silicon on insulator) substrate. The device isolation layer ST may be formed by a STI (shallow trench isolation) process and may include a silicon oxide layer. The active region may include a PMOSFET region PR and an NMOSFET region NR separated by the device isolation layer ST. Thus, although one PMOSFET region PR and NMOSFET region NR are shown, the active region may have more than one PMOSFET region PR and more than one PMOSFET region PR.

The device isolation layer ST may include a first device isolation layer ST1 separating the PMOSFET region PR from the NMOSFET region NR, and a second device isolation layer ST2 separating the first logic cell C1 from the logic cells C2, C3 and C4 adjacent to the first logic cell C1. The first device isolation layer ST1 and the second device isolation layer ST2 may be segments of a contiguous shallow trench isolation layer, i.e., may be connected to each other.

According to an embodiment of the inventive concept, the PMOSFET region PR and the NMOSFET region NR may be spaced apart from each other in the second direction D2 with the first device isolation layer ST1 between them. The first device isolation layer ST1 may extend in the first direction D1 to separate the PMOSFET region PR and the NMOSFET region NR. The second device isolation layer ST2 may extend in the first direction D1 to separate the first logic cell C1 and the second logic cell C2 adjacent to each other.

The device isolation layer ST may include a third device isolation layer ST3 defining active patterns AP in the PMOSFET region PR and the NMOSFET region NR. The third device isolation layer ST3 may extend in the first direction D1 and thus, the active patterns AP may extend in the first direction and may be spaced apart from one another in the second direction D2. Each active pattern AP may have an upper region (referred to hereinafter as an active fin AF) exposed by the third device isolation layer ST3. The active patterns AP may be provided in the PMOSFET region PR and the NMOSFET region NR. As illustrated in the drawings, three active patterns AP may be defined in each of the PMOSFET region PR and the NMOSFET region NR, respectively, but the inventive concept is not limited thereto.

The first, second and third device isolation layers ST1, ST2 and ST3 may have depths in a direction perpendicular to a top surface of the substrate 100. According to an embodiment of the inventive concept, the depth of the third device isolation layer ST3 may be smaller than the depths of the first and second device isolation layers ST1 and ST2. In this case, the third device isolation layer ST3 may be formed by a process separate from processes for forming the first and second device isolation layers ST1 and ST2. According to another embodiment of the inventive concept, the third device isolation layer ST3 may be formed simultaneously with the first and second device isolation layers ST1 and ST2 and may have the substantially same depth as the first and second device isolation layers ST1 and ST2.

Gate structures GS crossing the active patterns AP and extending in the second direction D2 may be formed on the substrate 100. The gate structures GS may be spaced apart from one another in the first direction D1. Each gate structure GS may extend in the second direction D2 to cross the PMOSFET region PR and the NMOSFET region NR. Each gate structure GS may include a gate insulating pattern 102, a gate electrode 104 and a capping pattern 106 that are sequentially stacked on the substrate 100. The gate insulating pattern 102 may include a silicon oxide layer and a silicon oxynitride layer or may include a dielectric layer having a dielectric constant higher than that of a silicon oxide layer. The gate electrode 104 may include at least one of doped semiconductor, metal and conductive metallic nitride. The capping pattern 106 may include at least one of a silicon oxide layer, a silicon nitride layer and a silicon oxynitride layer.

The gate insulating pattern 102, the gate electrode 104 and the capping pattern 106 may be formed by performing a patterning process after forming a gate insulating layer, a gate layer and a capping layer on the substrate 100. The gate insulating layer, the gate layer and the capping layer may be formed by a chemical vapor deposition process and/or a sputtering process.

Each gate structure GS may further include a gate spacer 108 formed on both sides of the gate electrode 104. Forming the gate spacer 108 may include forming a spacer layer covering the gate insulating pattern 102, the gate electrode 104 and the capping pattern 106 on the substrate 100 and performing an anisotropic etching process on the spacer layer. The spacer layer may include at least one of a silicon oxide layer, a silicon nitride layer and a silicon oxynitride layer.

Figure 2A:
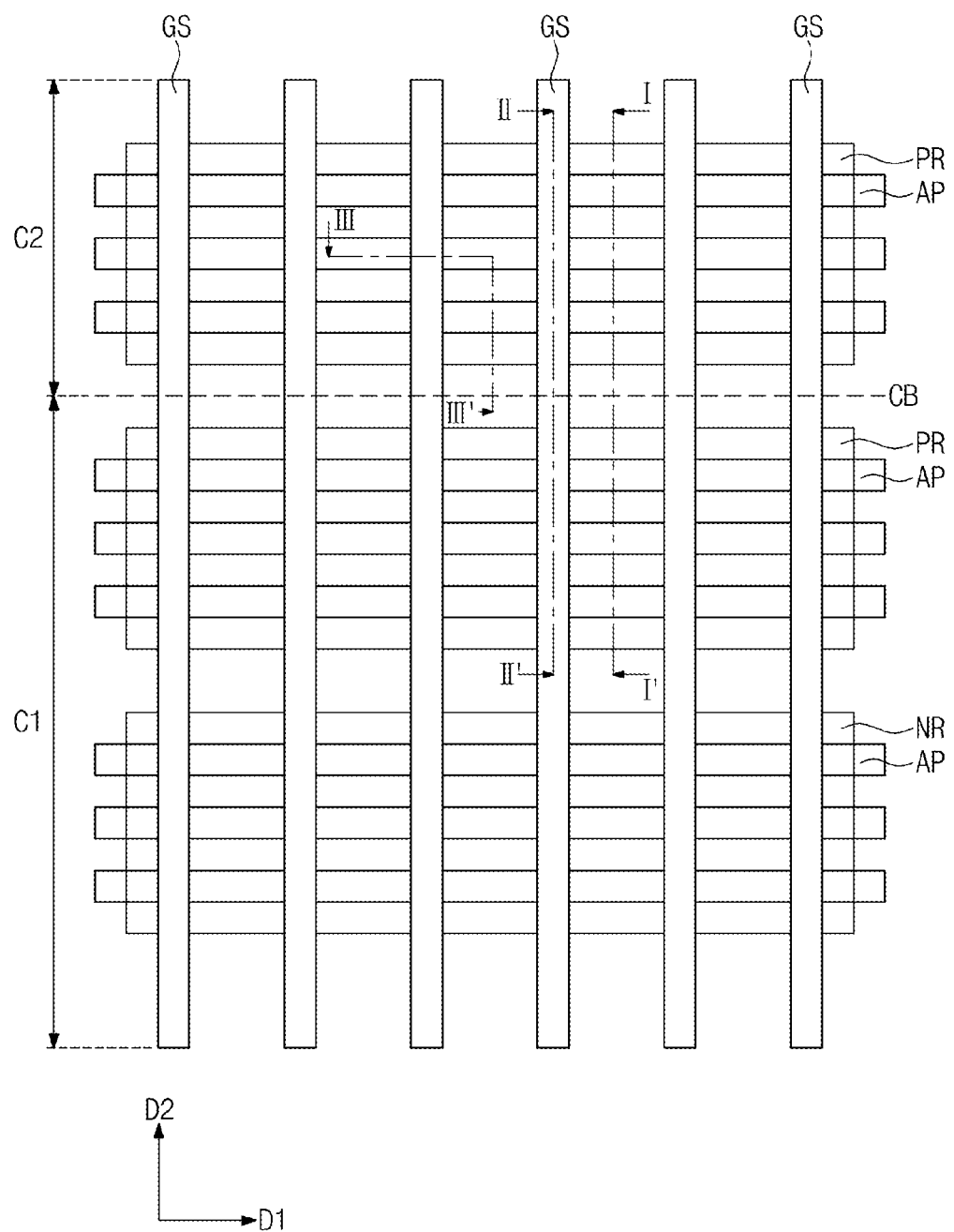
Figure 2B:
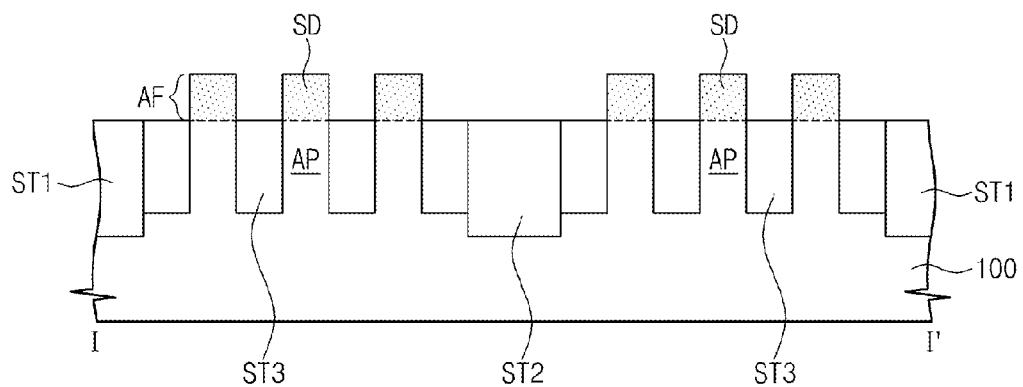
FIGS. 2B, 3B, 4B, 5B and 6B are cross-sectional views taken along lines I-I' of FIGS. 2A through 6A, respectively.
Figure 2C:
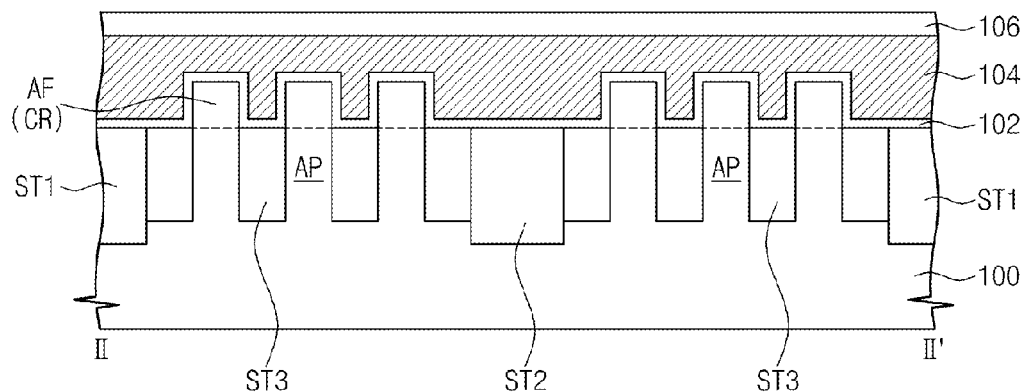
FIGS. 2C, 3C, 4C, 5C and 6C are cross-sectional views taken along lines II-II' of FIGS. 2A through 6A, respectively.
Figure 2D:
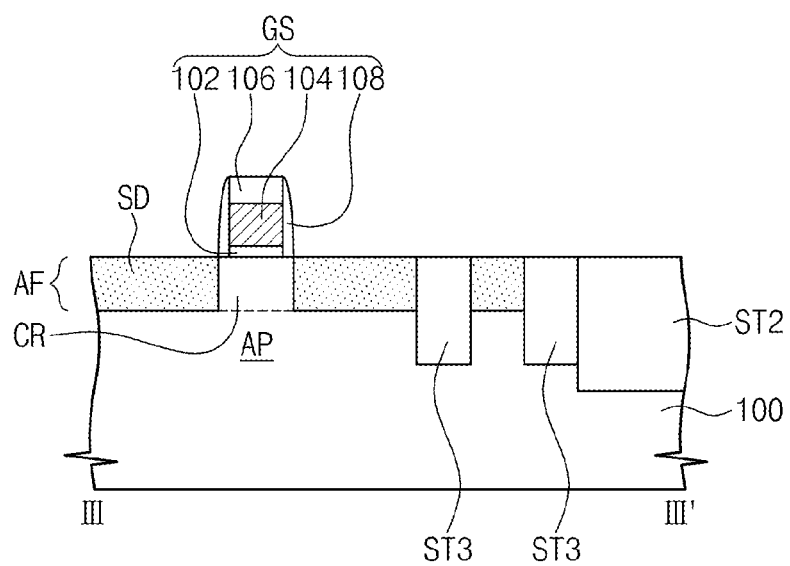
FIGS. 2D, 3D, 4D, 5D are cross-sectional views taken along lines III-III' of FIGS. 2A through 6A, respectively.
Figure 3A:
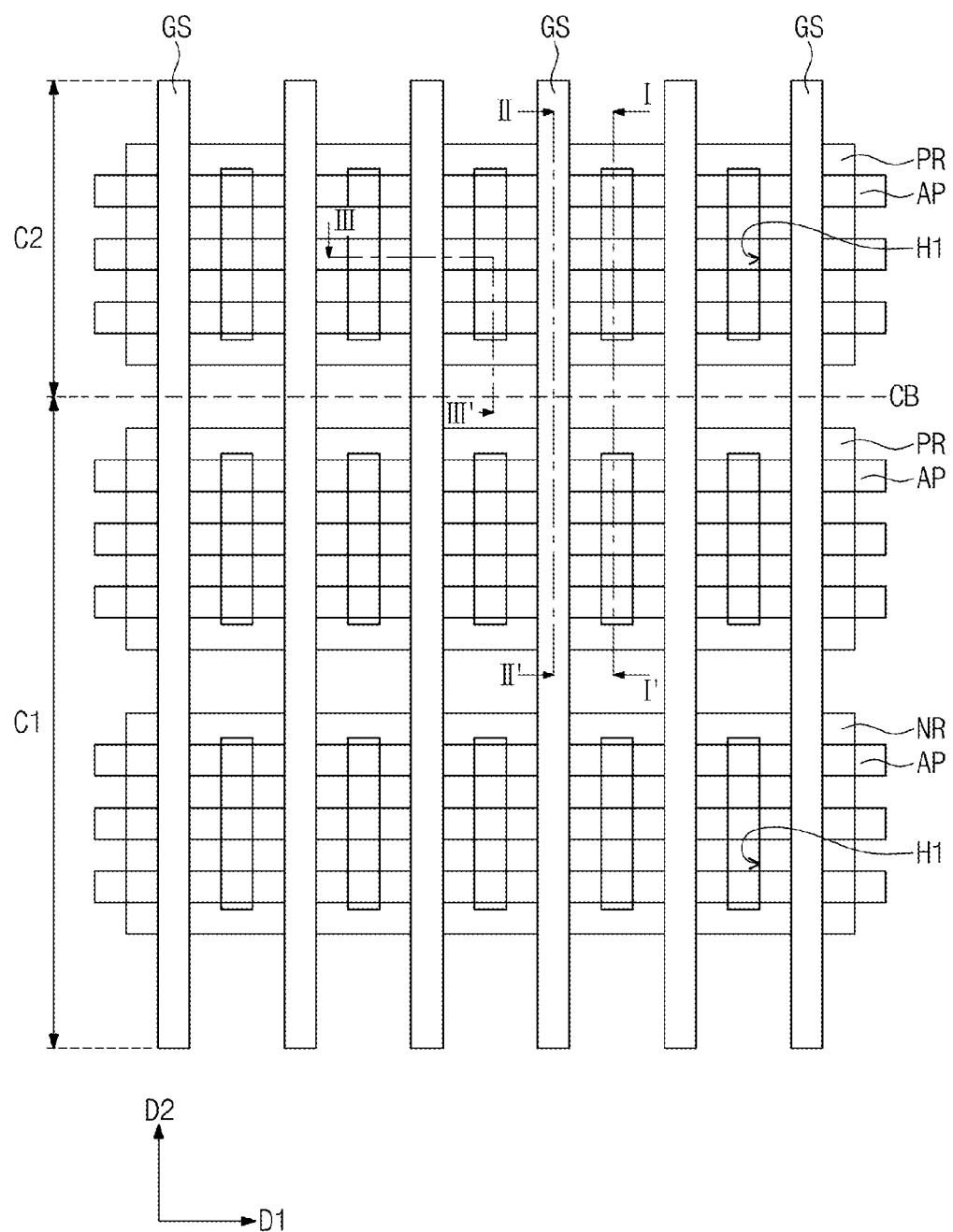
Figure 3B:
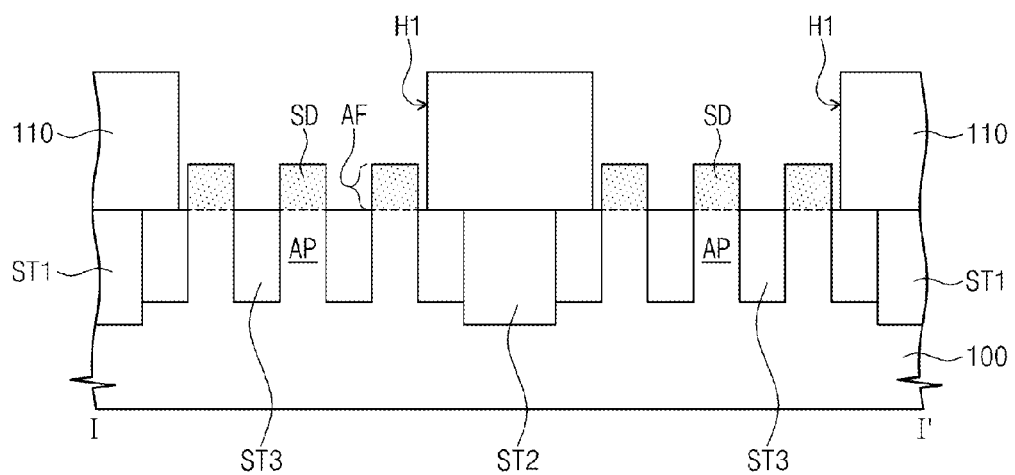
Figure 3C:
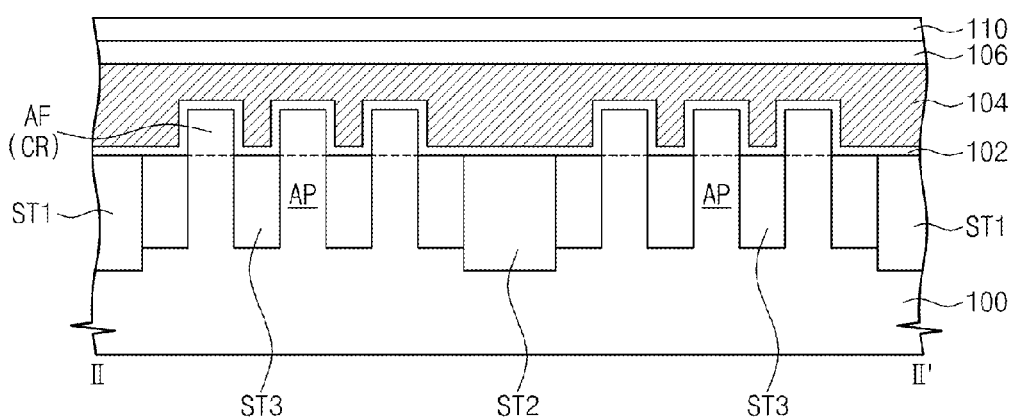
Figure 3D:
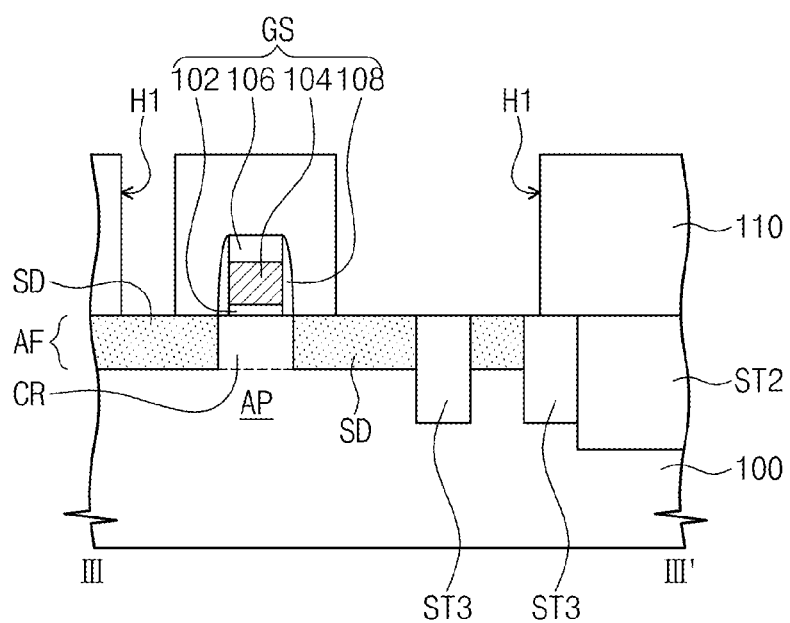
Figure 4A:
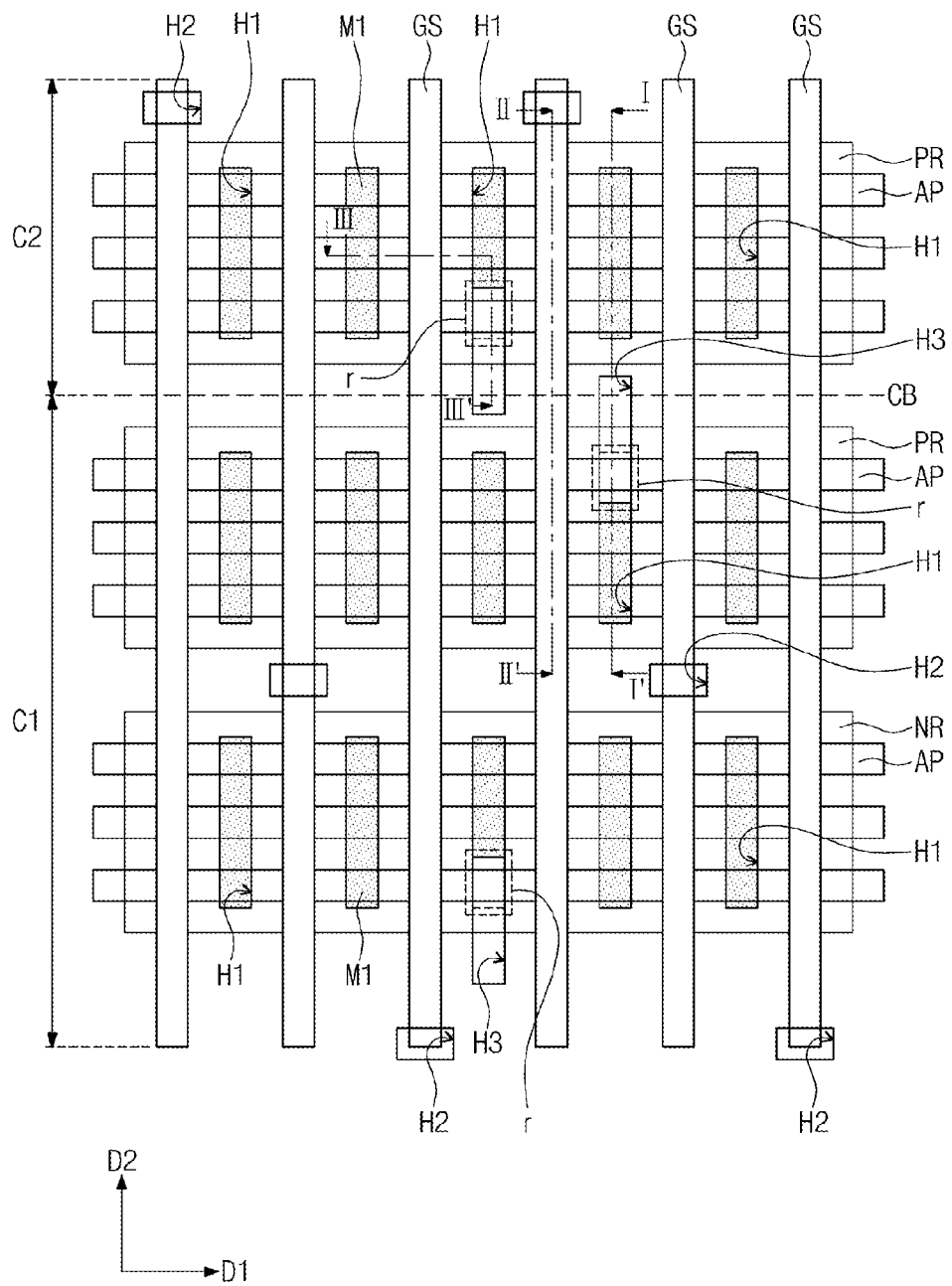
Figure 4B:
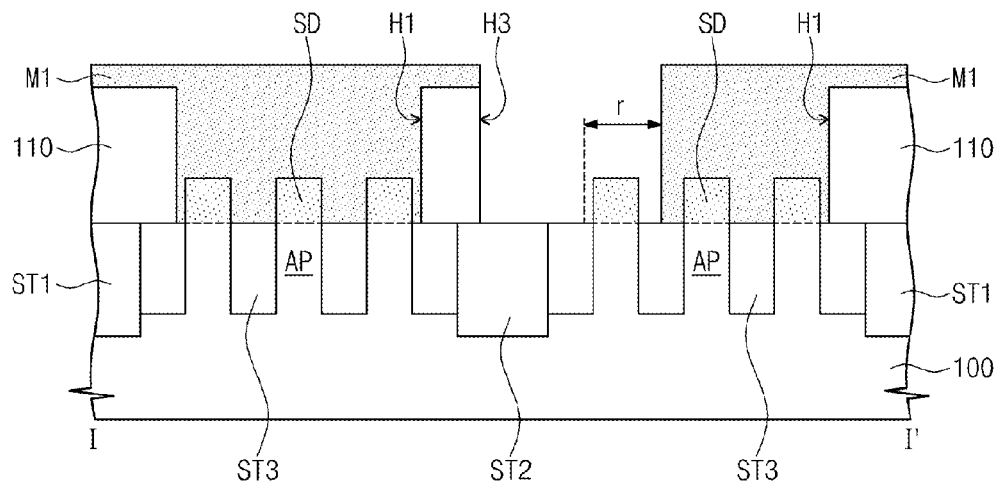
Figure 4C:
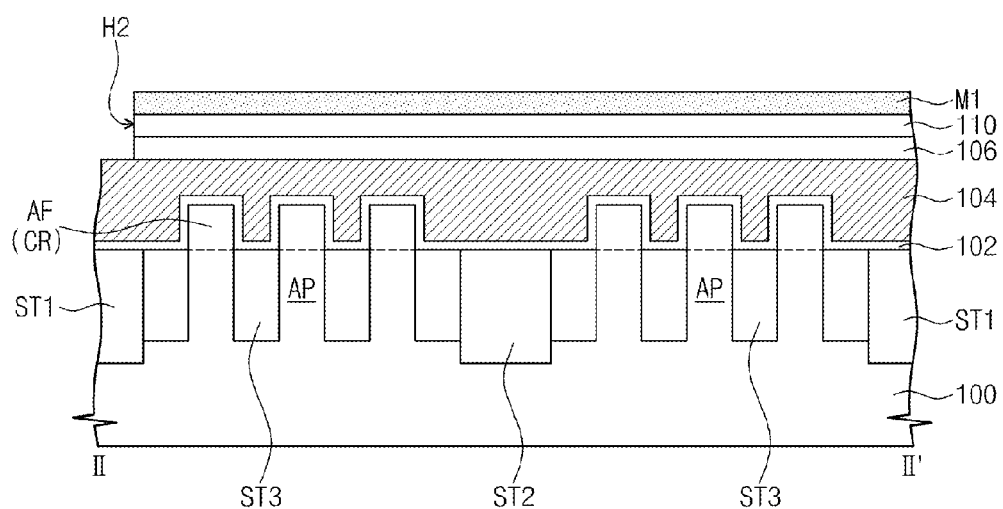
Figure 4D:
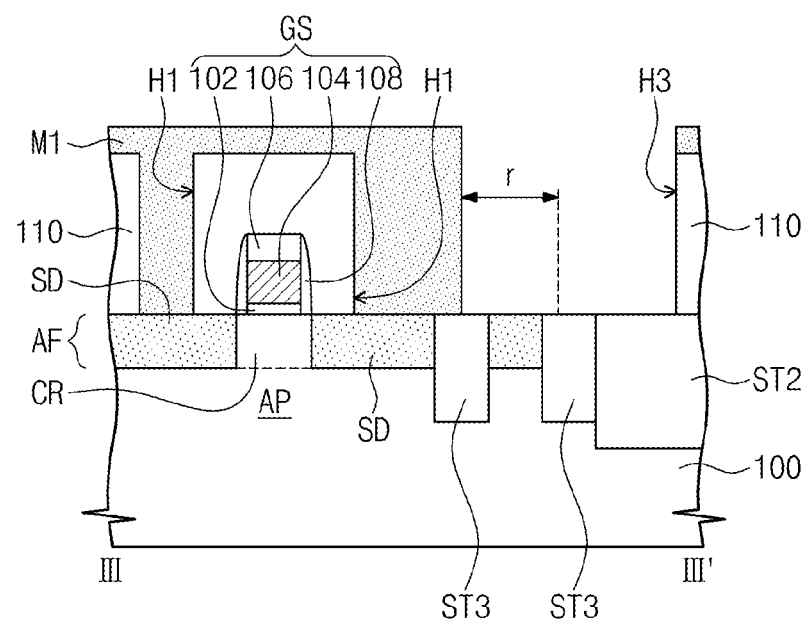
Figure 5A:
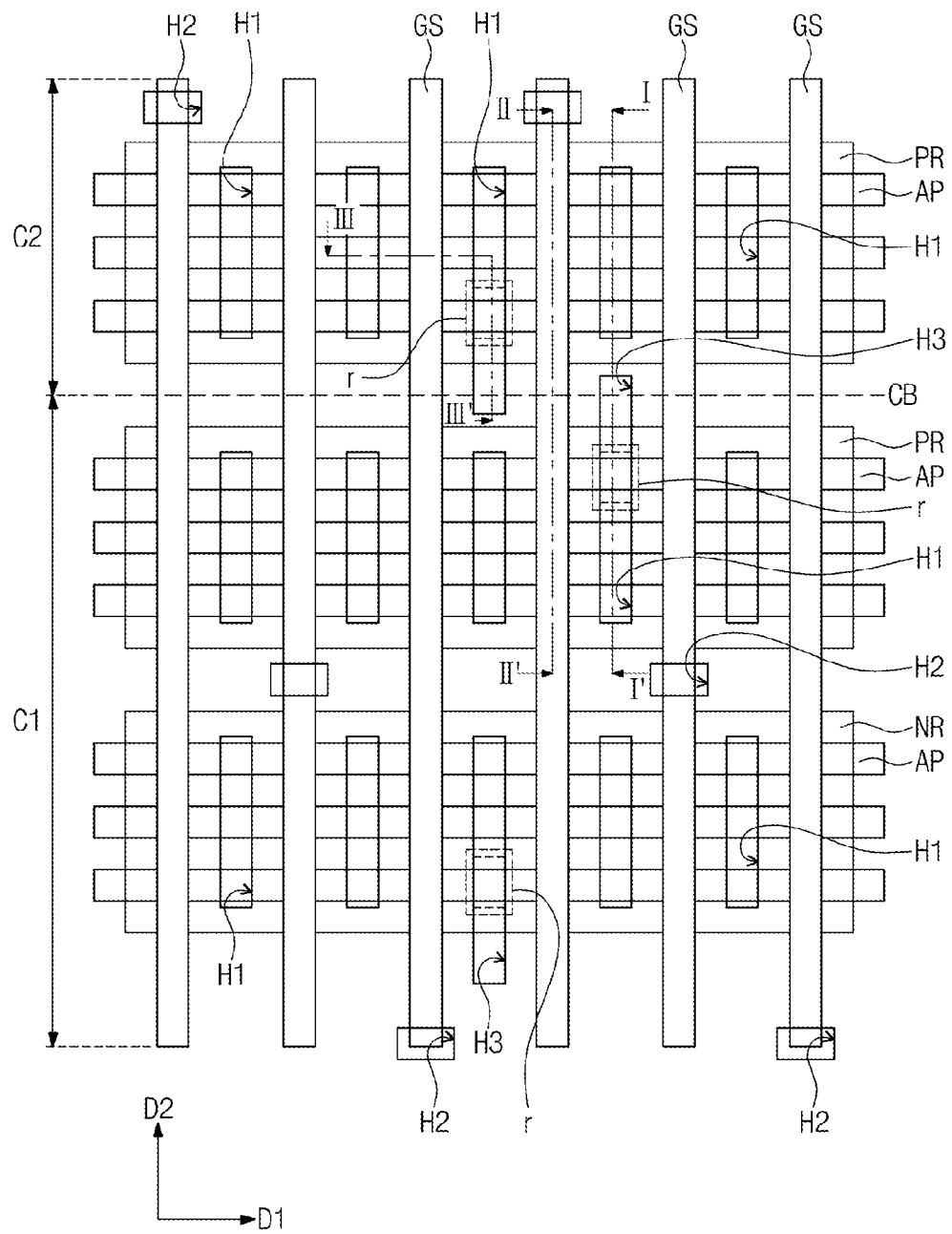
Figure 5B:
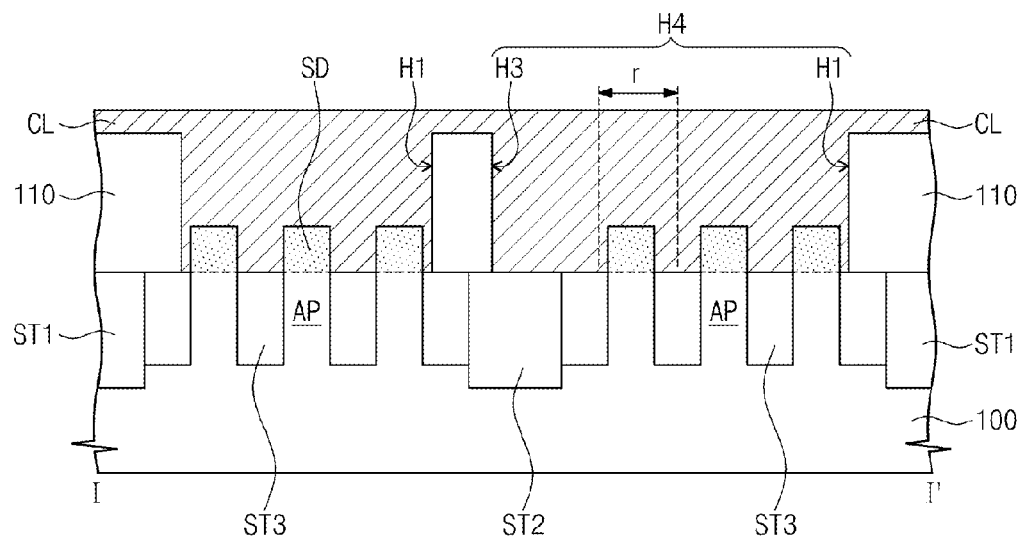
Figure 5C:
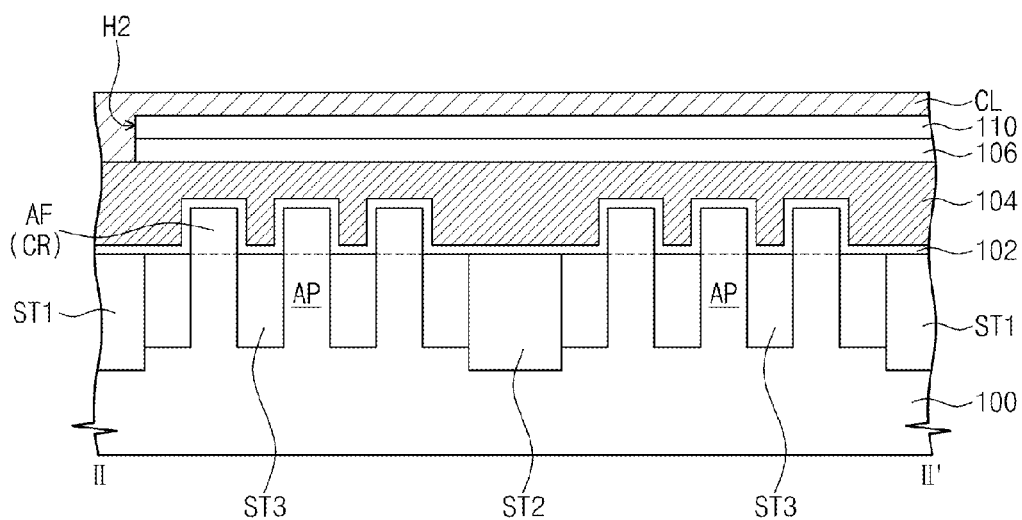
Figure 5D:
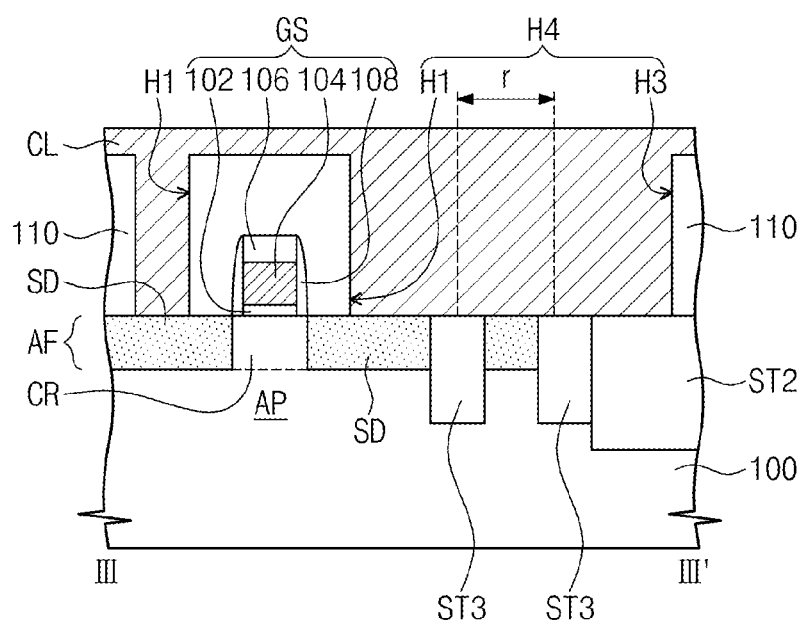

Source/drain regions SD may be formed by performing an ion implantation process on a resultant structure in which the gate structures GS are formed. The source/drain regions SD may be formed on both sides of each gate structure GS in or adjacent the active patterns AP. The source/drain regions SD, as illustrated in FIG. 2B, may be confined to the active fins AF but alternatively may extend between adjacent ones of the third device isolation layers ST3 as well. The ion implantation process may be performed using the gate structures GS as an ion implantation mask. Accordingly, the source/drain regions SD may not be formed in parts of the active patterns AP which are located under the gate structures GS. The parts of the active patterns AP which are located under the gate structures GS may be used as a channel region CR. In the PMOSFET region PR, the source/drain regions SD may be formed by implanting a p-type impurity. In an NMOSFET region NR, the source/drain regions SD may be formed by implanting an n-type impurity.

Referring to FIGS. 1, 3A through 3D, a first interlayer insulating layer 110 covering the gate structures GS may be formed on the substrate 100. The first interlayer insulating layer 110 may include at least one of a silicon oxide layer and a silicon oxynitride layer.

First contact holes H1 penetrating the first interlayer insulating layer 110 may be formed on both sides of each gate structure GS. According to an embodiment of the inventive concept, the first contact holes H1 may expose the source/drain regions SD. At least one of the first contact holes H1 may extend in the second direction D2 to expose the plurality of source/drain regions SD spaced apart from one another in the second direction D2. As an example, one of the first contact holes H1 may expose the source/drain regions SD spaced apart from one another in the second direction D2 in the PMOSFET region PR. Similarly, another one of the first contact holes H1 may expose the source/drain regions SD spaced apart from one another in the second direction D2 in the NMOSFET region NR. Although not illustrated in the drawing, another one of the first contact holes H1 may extend along a top surface of the device isolation layer ST to expose the source/drain regions SD of the PMOSFET region PR and the source/drain regions SD of the NMOSFET region NR.

According to another embodiment of the inventive concept, i.e., as an alternative to the processes illustrated in FIGS. 3A through 3D, before the first contact holes H1 are formed, conductive patterns (not illustrated) penetrating a lower portion of the first interlayer insulating layer 110 and connected to the source/drain regions SD may be formed on both sides of each gate structure GS. As an example, one of the conductive patterns, in the PMOSFET region PR, may electrically connect the source/drain regions SD spaced apart from one another in the second direction D2. The conductive patterns may directly contact the source/drain regions SD. Similarly, another one of the conductive patterns, in the NMOSFET region NR, may electrically connect the source/drain regions SD spaced apart from one another in the second direction D2. In this case, the first contact holes H1 may penetrate an upper portion of the first interlayer insulating layer 110 to expose top surfaces of the conductive patterns. One of the first contact holes H1 may extend in the second direction D2 along a top surface of the conductive pattern in the PMOSFET region PR or the NMOSFET region NR. Another one of the first contact holes H1 may extend on the device isolation layer ST to expose a top surface of the conductive pattern of the PMOSFET region PR and a top surface of the conductive pattern of the NMOSFET region NR.

The first contact holes H1 may be formed by a photolithography process using a first photomask (S10 of FIG. 19). Forming the first contact holes H1 may include forming a photoresist layer on the first interlayer insulating layer 110, forming a photoresist pattern having openings defining regions in which the first contact holes H1 will be formed by performing a photolithography process using the first photomask on the photoresist layer, etching the first interlayer insulating layer 110 exposed by the openings, and removing the photoresist pattern.

Referring to FIGS. 1, 4A through 4D, a first mask layer M1 filling the first contact holes H1 may be formed on the first interlayer insulating layer 110. The first mask layer M1 may be a SOH layer.

Second contact holes H2 may be formed through the first mask layer M1 and the first interlayer insulating layer 110 to expose the gate structures GS. Each of the second contact holes H2 may be formed to expose the gate electrode 104 of each of the gate structures GS.

A third contact hole H3 may be formed through the first mask M1 and the first interlayer insulating layer 110 in part of the region formerly occupied by one of the first contact holes H1, to the side of at least one of the gate structures GS. According to an embodiment of the inventive concept, the third contact hole H3 may expose a source/drain region SD. In addition, the third contact hole H3 may extend in the second direction D2 to expose a top surface of the device isolation layer ST. A plurality of such third contact holes H3 may be formed. In this case, the third contact holes H3 may overlap regions formerly occupied by the first contact holes H1, respectively.

The second contact holes H2 and the third contact holes H3 can be formed at the same time by performing a photolithography process using a second photomask (S20 of FIG. 19). Forming the second contact holes H2 and the third contact holes H3 may include forming a photoresist layer on the first mask layer M1, forming a photoresist pattern having openings defining regions in which the second contact holes H2 and the third contact holes H3 will be formed by performing a photolithography process using the second photomask on the photoresist layer, etching the first mask layer M1 and the first interlayer insulating layer 110 exposed by the openings, and removing the photoresist pattern.

The third contact hole H3 may be formed using a photomask different from the first contact holes H1 and may be formed using the same photomask as the second contact holes H2.

In the case in which a pair of the first contact holes H1 immediately adjacent to each other in the second direction D2 is formed at the same time using the same photomask, a minimum pitch between the first contact holes H1 depends on a resolution limit of an exposure process of the photolithography process. Accordingly, in the case in which the pitch between the first contact holes H1 is to be smaller than the minimum pitch, it may be difficult to form the pair of first contact holes H1 using the same photomask. In addition, in the case of forming the first contact holes H1 using separate photomasks, respectively, additional manufacturing costs of the semiconductor device are incurred.

According to the inventive concept, a third contact hole H3 is formed in the insulating layer 110 such that part of the insulating layer 110 is removed between the first contact holes H1 immediately adjacent to each other in the second direction D2. The third contact hole H3 may be formed using a photomask different from that used to form the pair of the first contact holes H1. Thus, a distance between the contact holes adjacent each other in the second direction D2 and ultimately provided by the forming of the first contact holes H1 and the third contact hole H3 is not constrained by the resolution limit of an exposure process. In addition, according to an embodiment of the inventive concept, as the third contact hole H3 is formed using the same photomask as the second contact holes H2, the manufacturing cost of the semiconductor device may be minimized.

Referring to FIGS. 1 and 5A through 5D, the first mask layer M1 may be removed. The first mask layer M1 may be removed by performing an ashing process and/or a strip process. As the first mask layer M1 is removed, a single connection hole H4, corresponding to the combination of the third contact hole H3 and the first contact hole H1, may be formed in the interlayer insulating layer 110. The connection hole H4 may include an overlap region (r) in which the third contact hole H3 and the first contact hole H1 overlap.

A conductive layer CL filling the contact holes H1, H2 and H3 may be formed on the first interlayer insulating layer 110. The conductive layer CL may include at least one of doped semiconductor, metal and conductive metallic nitride.

Referring to FIGS. 1 and 6A through 6D, the conductive layer CL may be planarized until the first interlayer insulating layer 110 is exposed. Accordingly, first contacts CT1, second contacts CT2 and a third contact CT3 may be formed in the first contact holes H1, the second contact holes H2 and the third contact hole H3, respectively. The third contact CT3 may be connected to one of the first contacts CT1. In the case in which a plurality of the third contacts CT3 is provided, the third contacts CT3 may be connected to corresponding ones of the first contacts CT1, respectively. A connection contact CT4 may be constituted by the third contact CT3 and the first contact CT1 connected to the third contact CT3. The connection contact CT4 may include an overlap portion (p) in which the third contact CT3 and the first contact CT1 connected thereto overlap. By the planarization process, top surfaces of the first contacts CT1, top surfaces of the second contacts CT2, and a top surface of the third contact CT3 may be located at the same level, i.e., at the same distance from an upper surface of the substrate 100. Accordingly, a top surface of the connection contact CT4 may be substantially coplanar with a top surface of the first interlayer insulating layer 110.

A second interlayer insulating layer 120 may be formed on the first interlayer insulating layer 110. The second interlayer insulating layer 120 may include an oxide layer, a nitride layer and/or an oxynitride layer. A via 122 penetrating the second interlayer insulating layer 120 and connected to the third contact CT3 may be formed in the second interlayer insulating layer 120. The via 122 may include at least one of doped semiconductor, metal and conductive metallic nitride.

Figure 6A:
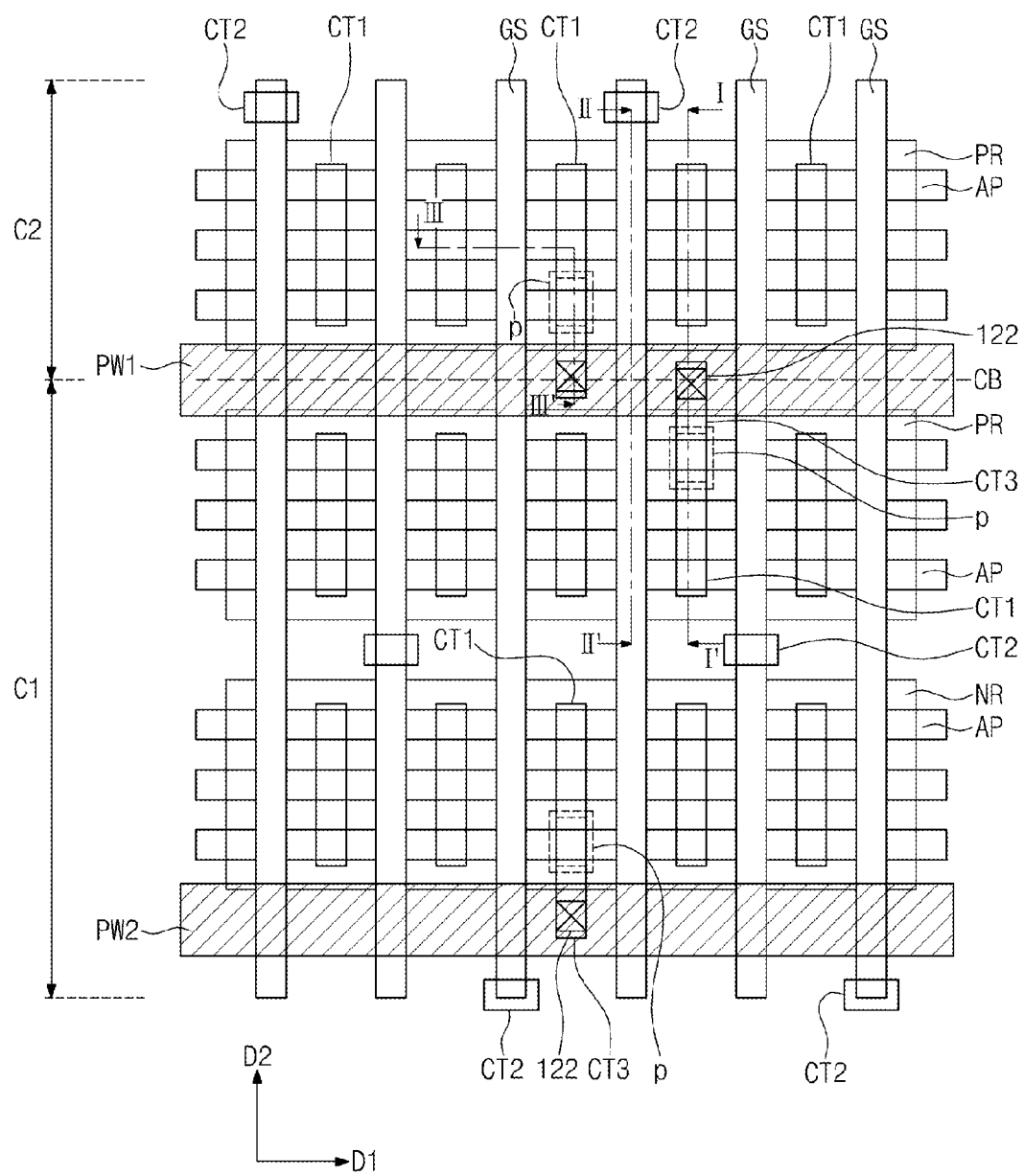
Figure 6B:
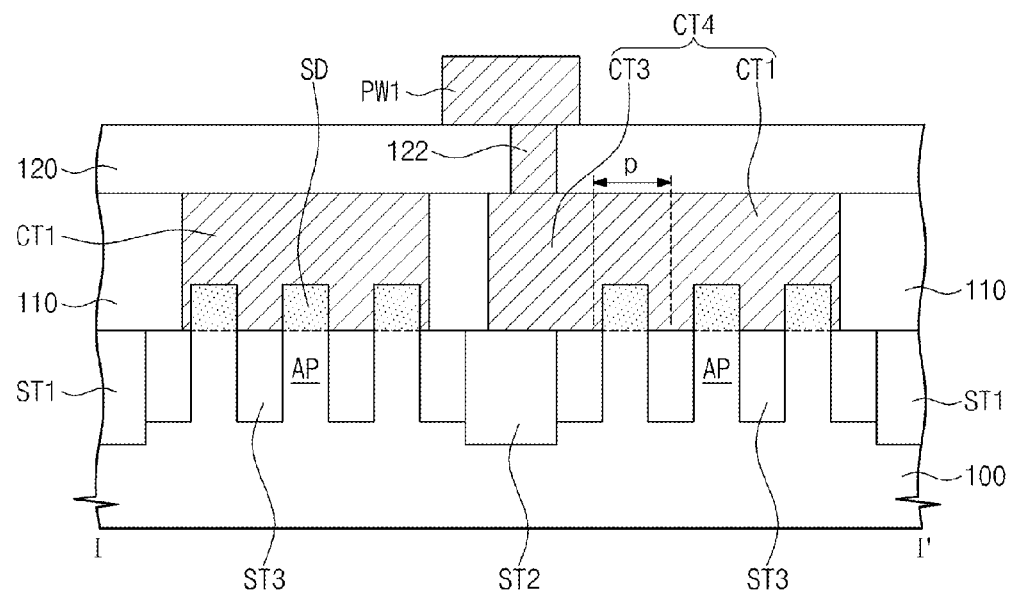
Figure 6C:
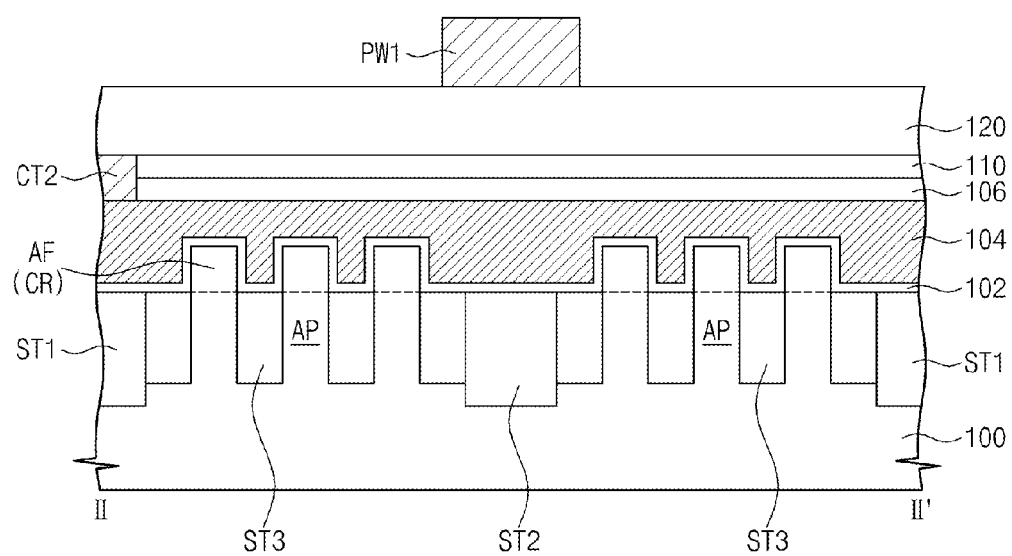
Figure 6D:
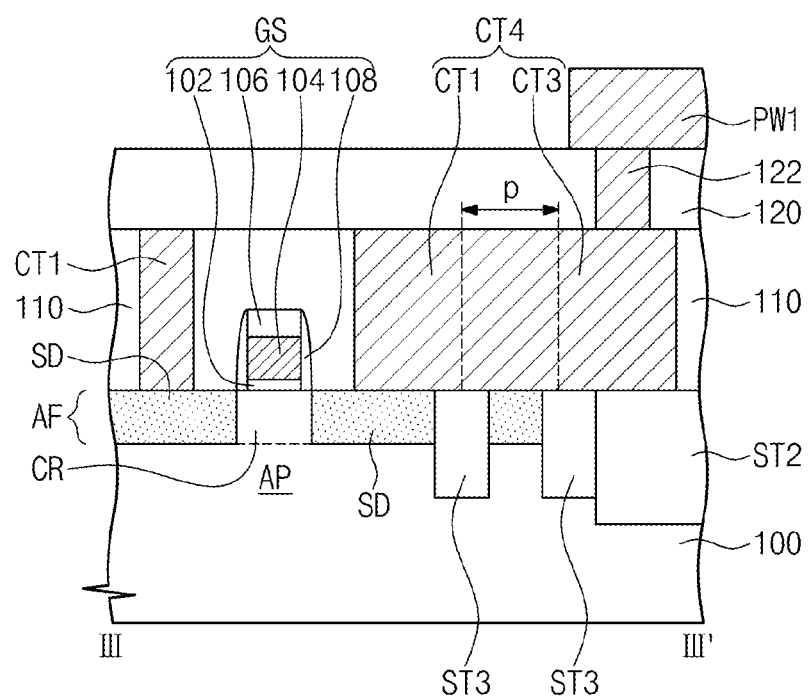

A first common conductive line PW1 that overlaps the PMOSFET region PR and a second common conductive line PW2 that overlaps the NMOSFET region NR may be formed on the second interlayer insulating layer 120. When viewed from above, i.e., in plan, the first and second common conductive lines PW1 and PW2 may extend in the first direction D1 and may be spaced apart from each other in the second direction D2. The first and second common conductive lines PW1 and PW2 may be shared by the logic cells C1 and C3 adjacent to each other in the first direction D1. According to some embodiments of the inventive concept, as illustrated in FIG. 6A, each of the first and second common conductive lines PW1 and PW2 may be shared by the logic cells C1 and C2 adjacent to each other in the second direction D2. According to some other embodiments of the inventive concept, each of the first and second common conductive lines PW1 and PW2 are not shared by the logic cells C1 and C2 adjacent to each other in the second direction D2. Although not illustrated in FIG. 6A, in the case in which each of the first and second common conductive lines PW1 and PW2 is not shared by the logic cells C1 and C2 adjacent to each other in the second direction D2, the PMOSFET region PR of the first logic cell C1 may be adjacent to the NMOSFET region NR of the second logic cell C2 in the second direction D2. The first and second common conductive lines PW1 and PW2 may include at least one of doped semiconductor, metal and conductive metallic nitride.

The third contact CT3 may be connected to one of the first and second common conductive lines PW1 and PW2 through the via 122. As illustrated in FIG. 6A, a third contact CT3 may be provided on the PMOSFET region PR as connected to the first common conductive line PW1. A third contact CT3 may be provided on the NMOSFET region NR as connected to the second common conductive line PW2. In the case in which the third contact CT3 is connected to the first common conductive line PW1, the first common conductive line PW1 may apply a drain voltage Vdd, that is, a power voltage to the source/drain region SD through the via 122, the third contact CT3 and the first contact CT1 connected to the third contact CT3 (that is, the via 122 and the connection contact CT4). In the case in which the third contact CT3 is connected to the second common conductive line PW2, the second common conductive line PW2 may apply a source voltage Vss, that is, a ground voltage to the source/drain region SD through the via 122, the third contact CT3 and the first contact CT1 connected to the third contact CT3 (that is, the via 122 and the connection contact CT4).

If the first contacts CT1 immediately adjacent to each other in the second direction D2 were formed using the same photomask, as described above, a minimum pitch between the pair of the first contacts CT1 would depend on a resolution limit of an exposure process. If the third contact CT3 were not formed between the pair of the first contacts CT1, at least one of the pair of the first contacts CT1 would have to be directly connected to the first common conductive line PW1 or the second common conductive line PW2 through the via 122. In this case, the disposition of (i.e., freedom to lay out) the via 122 would be limited by the minimum pitch between the pair of the first contacts CT1 and hence, the disposition of the common conductive lines PW1 and PW2 would also be limited.

According to the inventive concept, in the case in which the third contact CT3 connected to at least one of the pair of the first contacts CT1 is formed between the pair of the first contacts CT1, the at least one of the pair of the first contacts CT1 may be connected to the first common conductive line PW1 or the second common conductive line PW2 through the third contact CT3 and the via 122. Because the third contact CT3 is formed using a photomask different from that used to form the pair of the first contacts CT1, the via 122 may be freely disposed on the third contact CT3 without being limited by the minimum pitch between the pair of the first contacts CT1 and the layouts of the common conductive lines PW1 and PW2 may not be limited by the minimum pitch between the pair of the first contacts CT1.

Although not illustrated in the drawings, conductive lines electrically connected to the first contacts CT1, which are not connected to the third contact CT3, and the second contacts CT2 may be formed on the substrate 100. Some of the conductive lines may apply a voltage to the source/drain regions SD through the first contacts CT1 which are not connected to the third contact CT3. Others of the conductive lines may apply a gate voltage to the gate structures GS through the second contacts CT2.

A method of manufacturing a semiconductor device in accordance with a modified example of the first embodiment of the inventive concept is shown in FIGS. 7A-7D. A description of some features already described above, i.e., common to the previous examples, will be omitted.

As described with reference to FIGS. 1, 2A through 2D and 3A through 3D, a device isolation layer ST may be formed on the substrate 100 to define an active region. Also, gate structures GS, source/drain regions SD, a first interlayer insulating layer 110 covering the gate structures GS, and first contact holes H1 penetrating the first interlayer insulating layer 110 on both sides of each gate structure GS are formed.

The first contact holes H1 may be formed using the same method as that described with reference to FIGS. 3A through 3D.

As described with reference to FIGS. 1 and 4A through 4D, a first mask layer M1 filling the first contact holes H1 may be formed on the first interlayer insulating layer 110. Second contact holes H2 may be formed through the first mask layer M1 and the first interlayer insulating layer 110 to expose the gate structures GS. More particularly, each of the second contact holes H2 may expose the gate electrode 104 of a gate structure GS.

According to this example of the inventive concept, the third contact hole H3 is formed in the first mask layer M1 through a portion of the first interlayer insulating layer 110 located in the region between the first contact holes H1 which had been formed adjacent to each other in the second direction D2. That is, the third contact hole H3 is longer in the second direction D2 than that shown in FIG. 4B such that it overlaps regions formerly occupied by the first contact holes H1, respectively. That is, the third contact hole H3 may include overlap regions (r).

The third contact hole H3 may be formed using a photomask different from that used to form the first contact holes H1 and may be formed at the same time using the same photomask as that used to form the second contact holes H2. The second contact holes H2 and the third contact hole H3 may be formed using the method described with reference to FIGS. 4A through 4D.

Referring to FIGS. 7A through 7D, the first mask layer M1 may be removed. The first mask layer M1 may be removed by performing an ashing process and/or a strip process. A conductive layer CL filling the contact holes H1, H2 and H3 may be formed on the first interlayer insulating layer 110 and the conductive layer CL may be planarized until the first interlayer insulating layer 110 is exposed. Accordingly, first contacts CT1, second contacts CT2, and a third contact CT3 may be formed in the first contact holes H1, the second contact holes H2, and the third contact hole H3 respectively.

According to the modified example of the inventive concept, the third contact CT3 may be formed in regions of the first contact holes H1 immediately adjacent to each other in the second direction D2. A connection contact CT4 may be defined by the third contact CT3 and the pair of the first contacts CT1 connected thereto. The connection contact CT4 may include overlap portions (P) formed where the third contact hole H3 coincided with the first contact holes H1. By the planarization process, top surfaces of the first contacts CT1, top surfaces of the second contacts CT2, and a top surface of the third contact CT3 may be located at the same level. Accordingly, a top surface of the connection contact CT4 may be substantially coplanar with a top surface of the first interlayer insulating layer 110.

A second interlayer insulating layer 120 may be formed on the first interlayer insulating layer 110. A via 122 penetrating the second interlayer insulating layer 120 and being connected to the third contact CT3 may be formed in the second interlayer insulating layer 120.

Figure 7A:
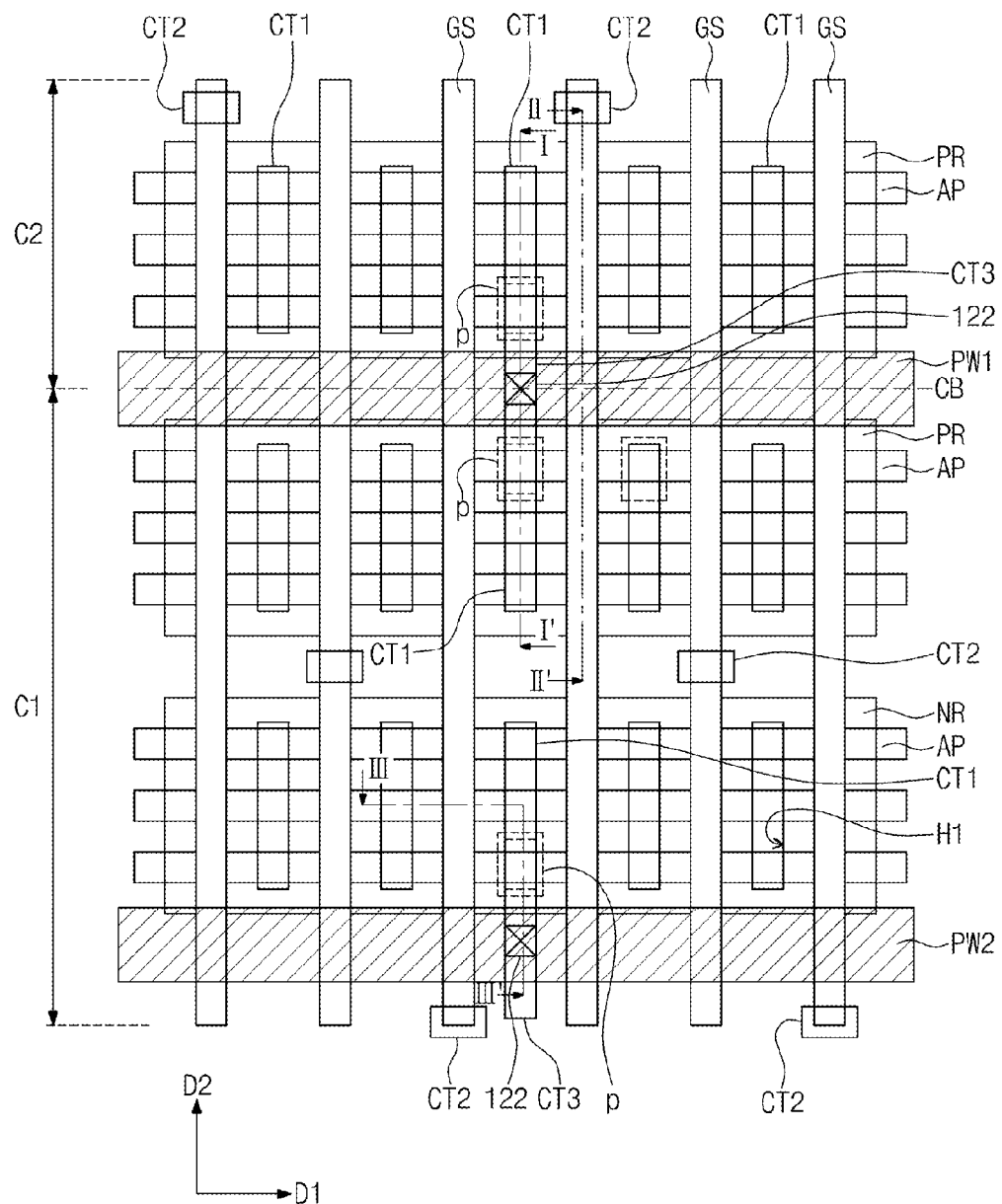
Figure 7B:
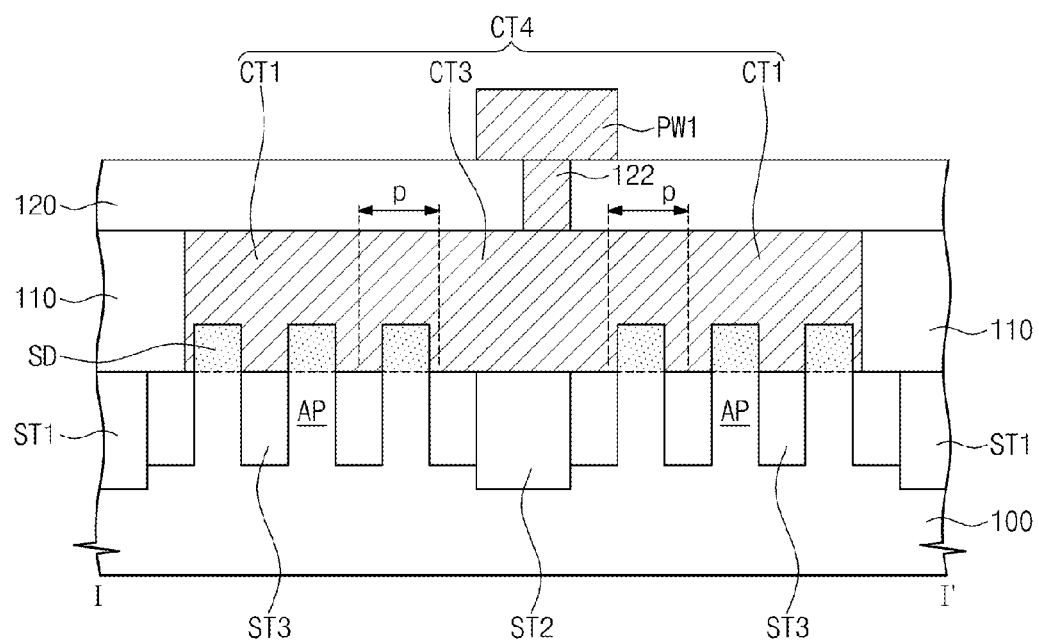
Figure 7C:
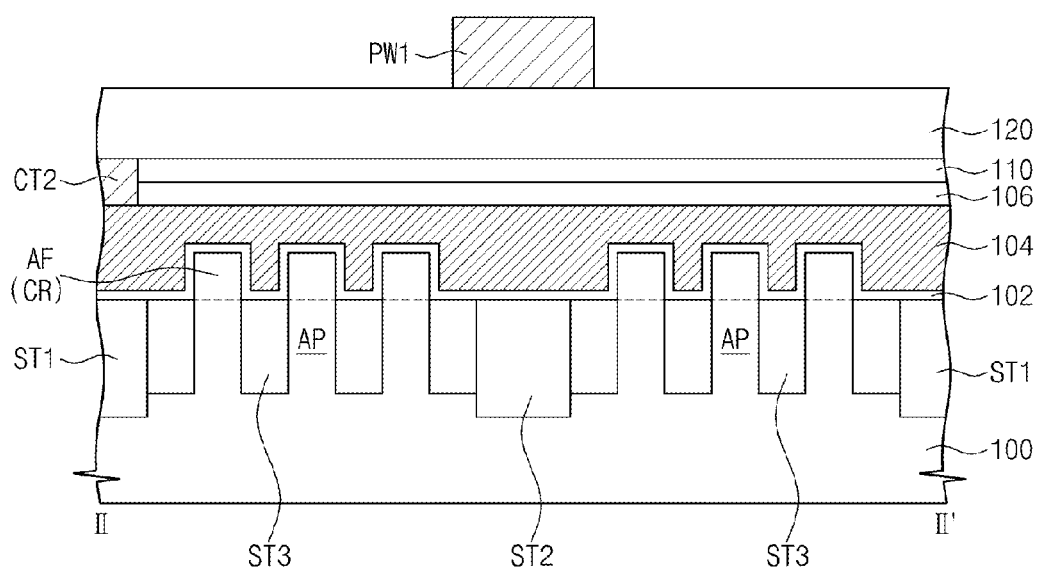
Figure 7D:
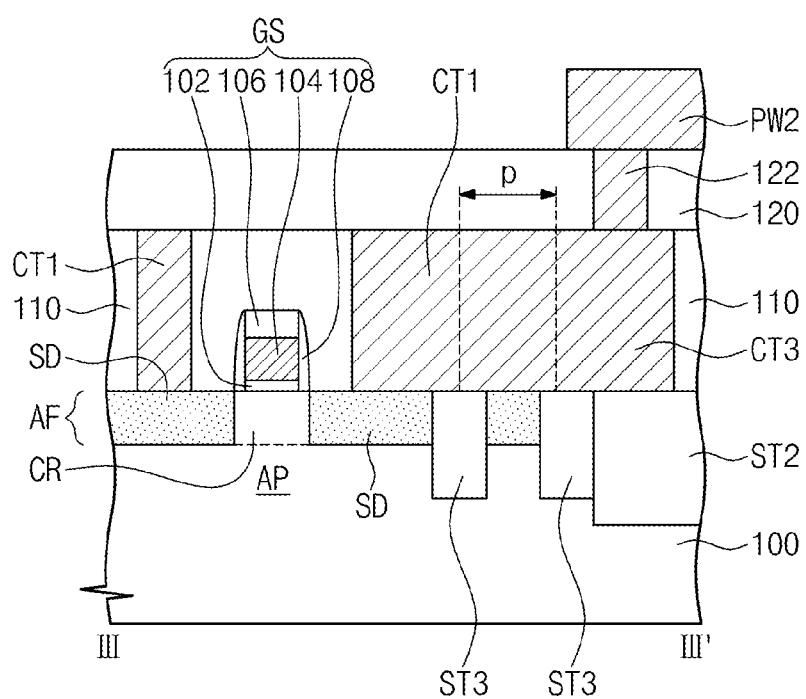
Figure 8A:
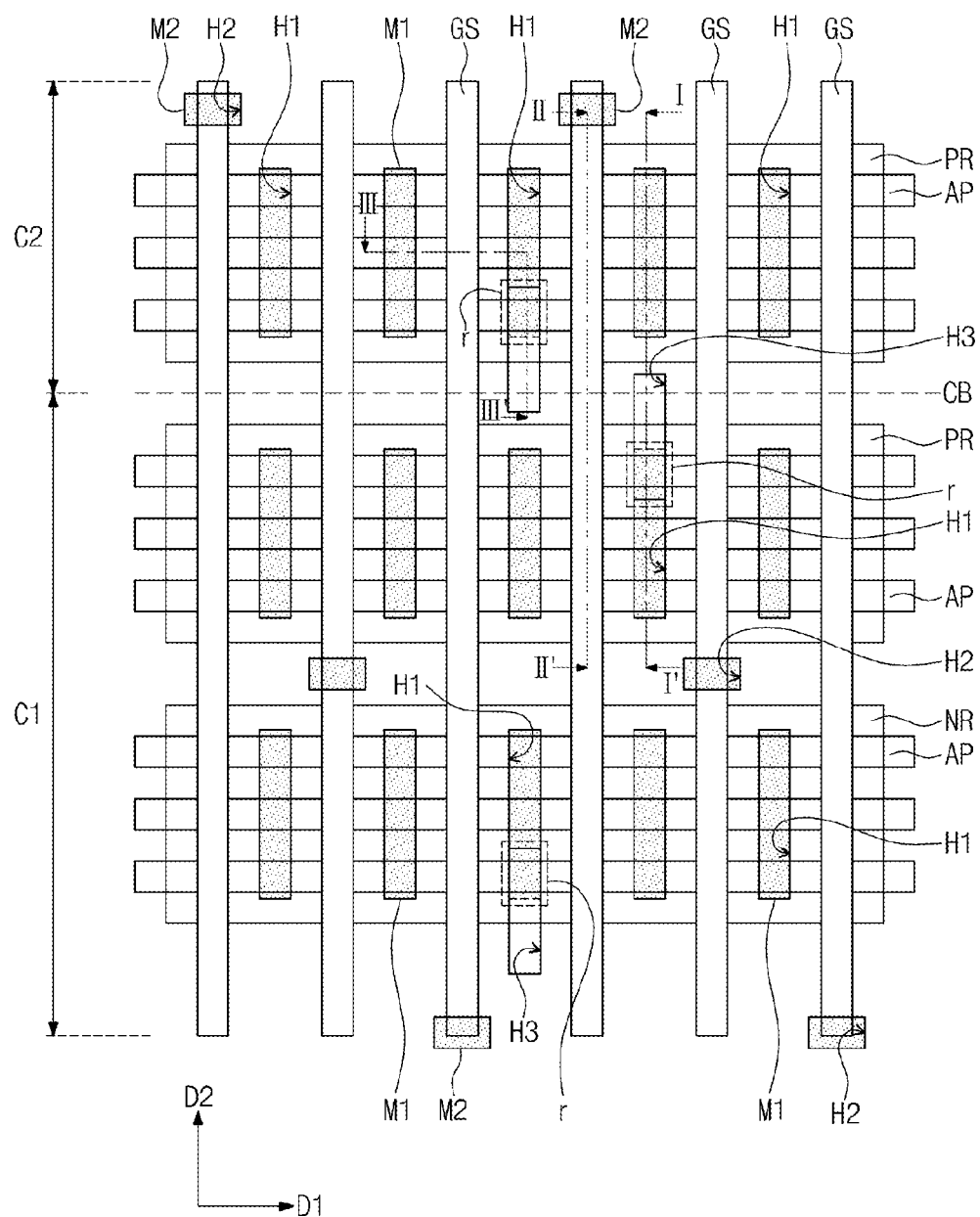
Figure 8B:
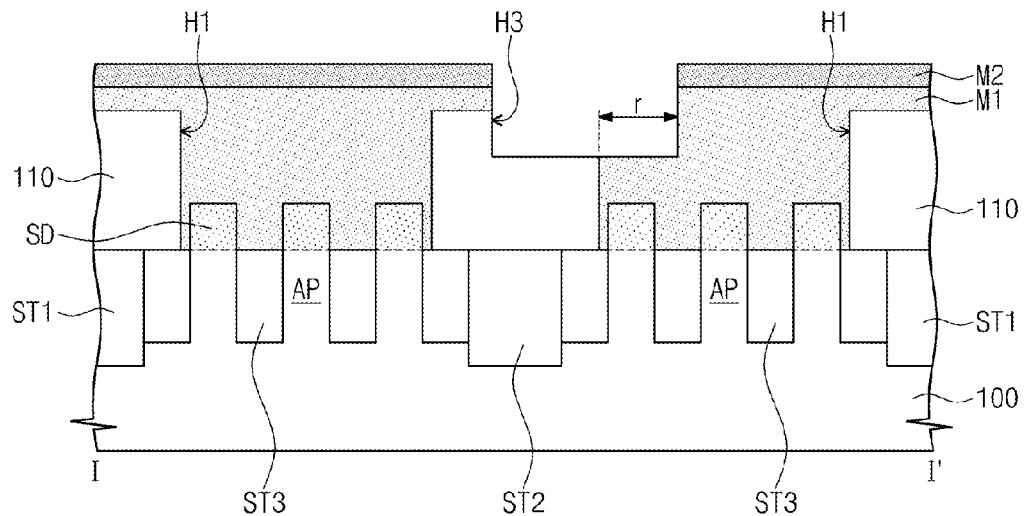
FIGS. 8B, 9B and 10B are cross-sectional views taken along lines I-I' of FIGS. 8A through 10A, respectively.
Figure 8C:
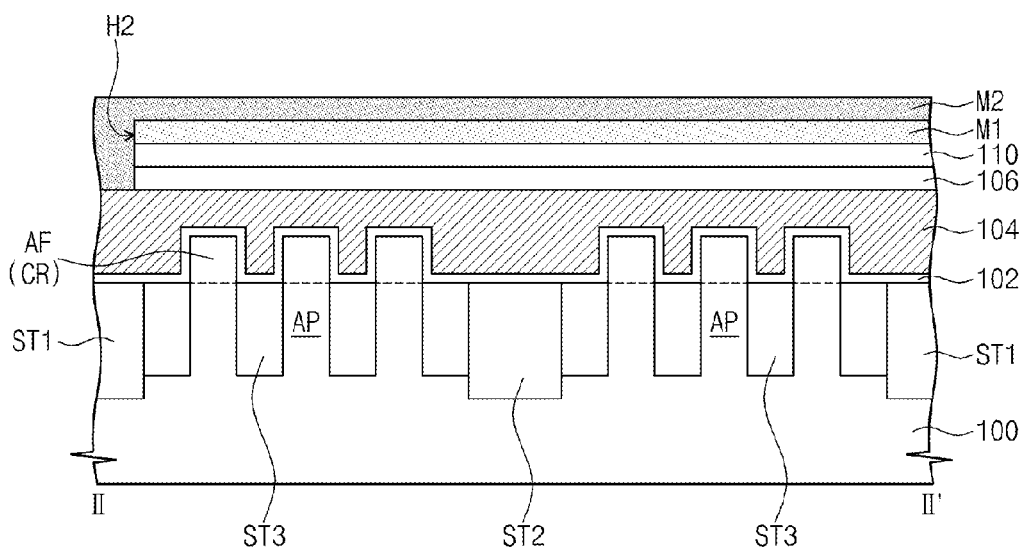
FIGS. 8C, 9C and 10C are cross-sectional views taken along lines II-II' of FIGS. 8A through 10A, respectively.
Figure 8D:
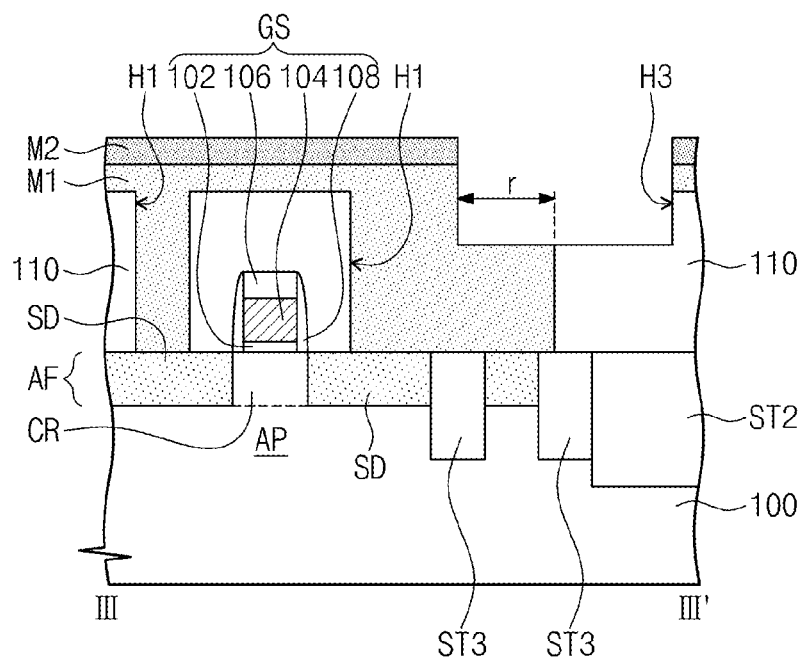
Figure 9A:
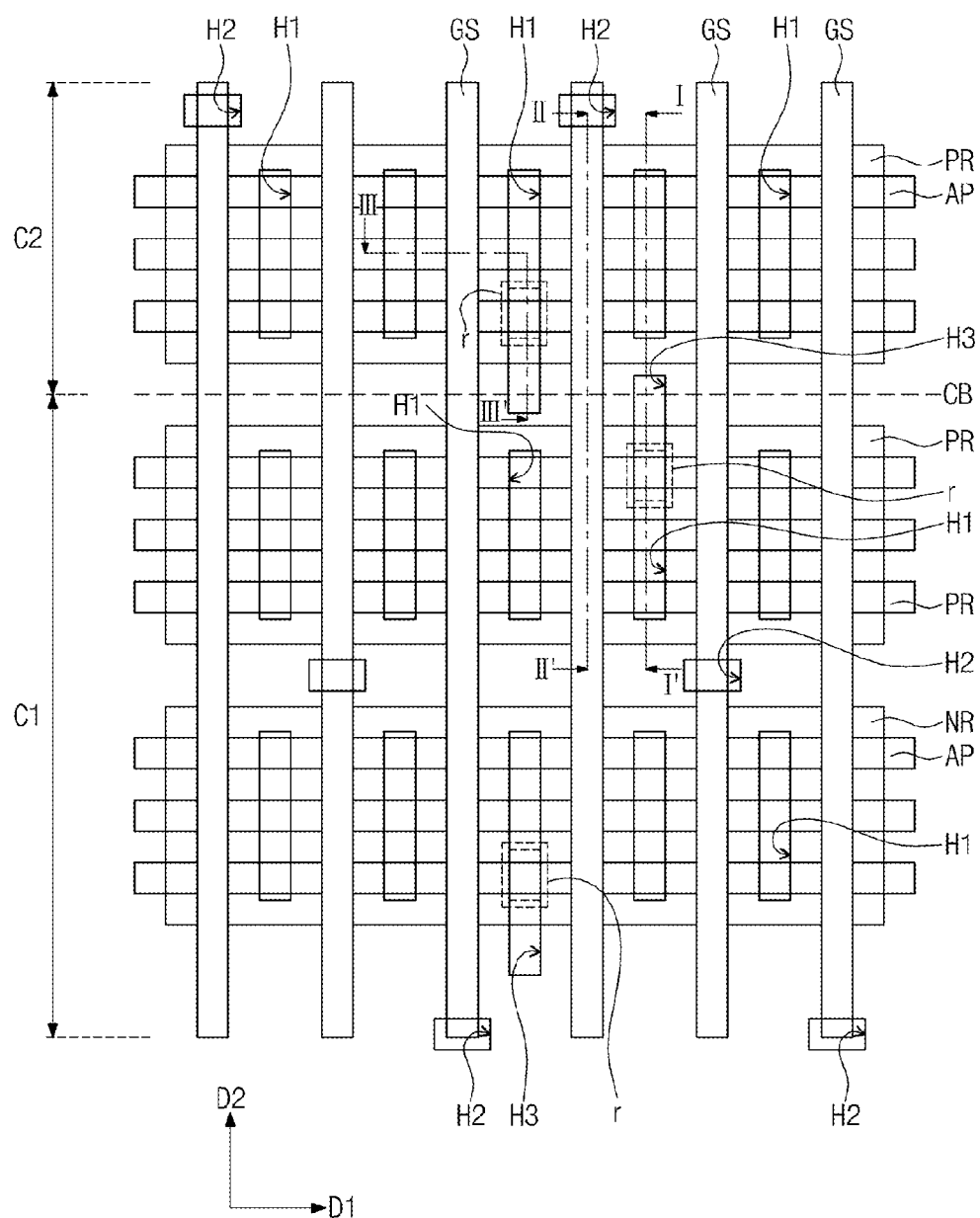
Figure 9B:
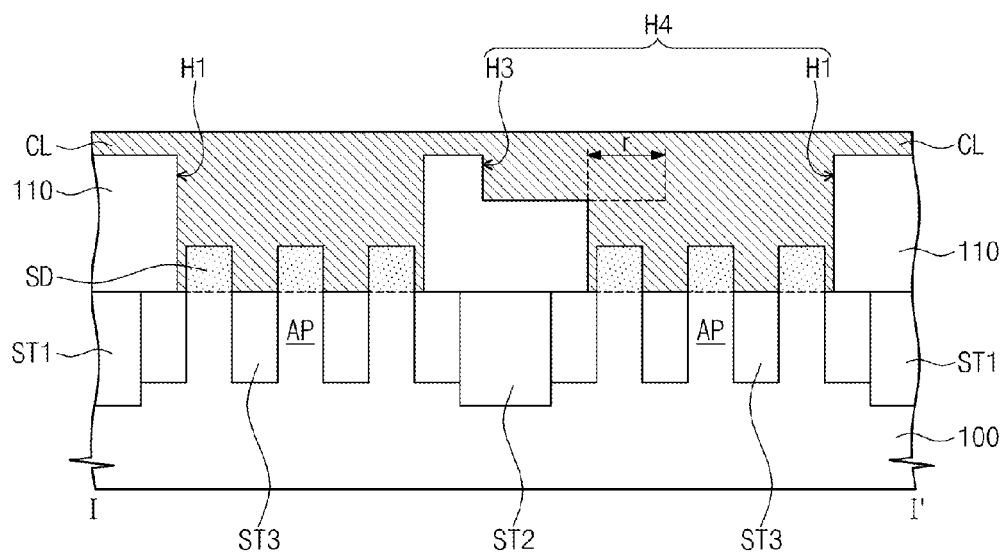
Figure 9C:
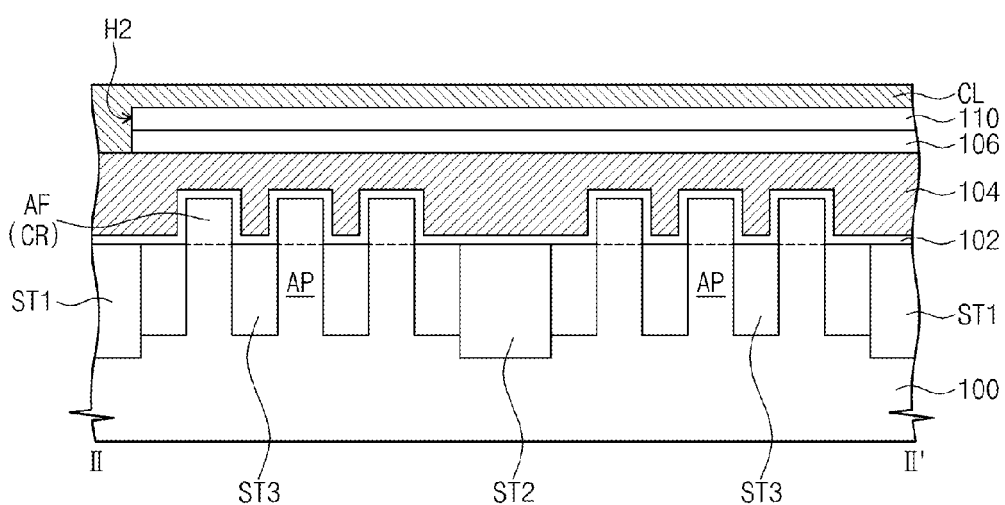
Figure 9D:
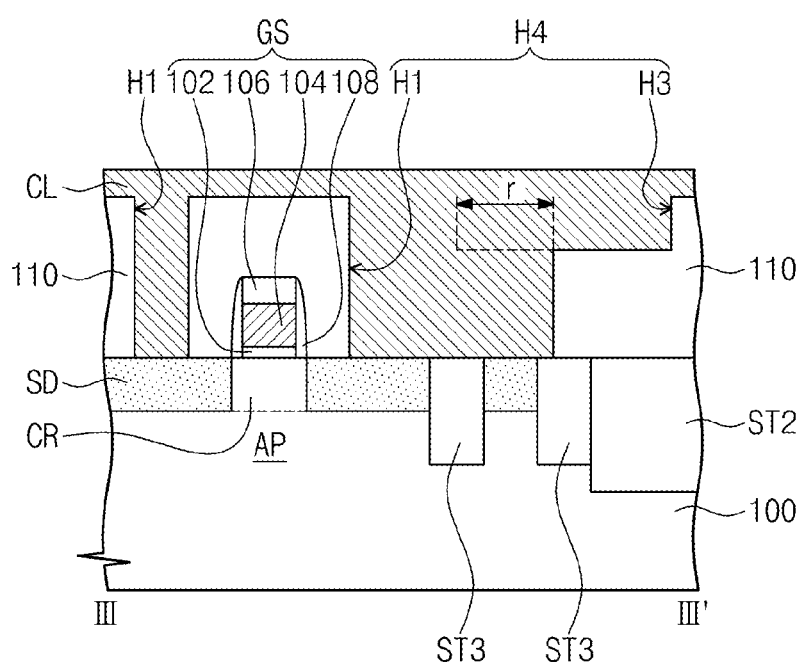
Figure 10A:
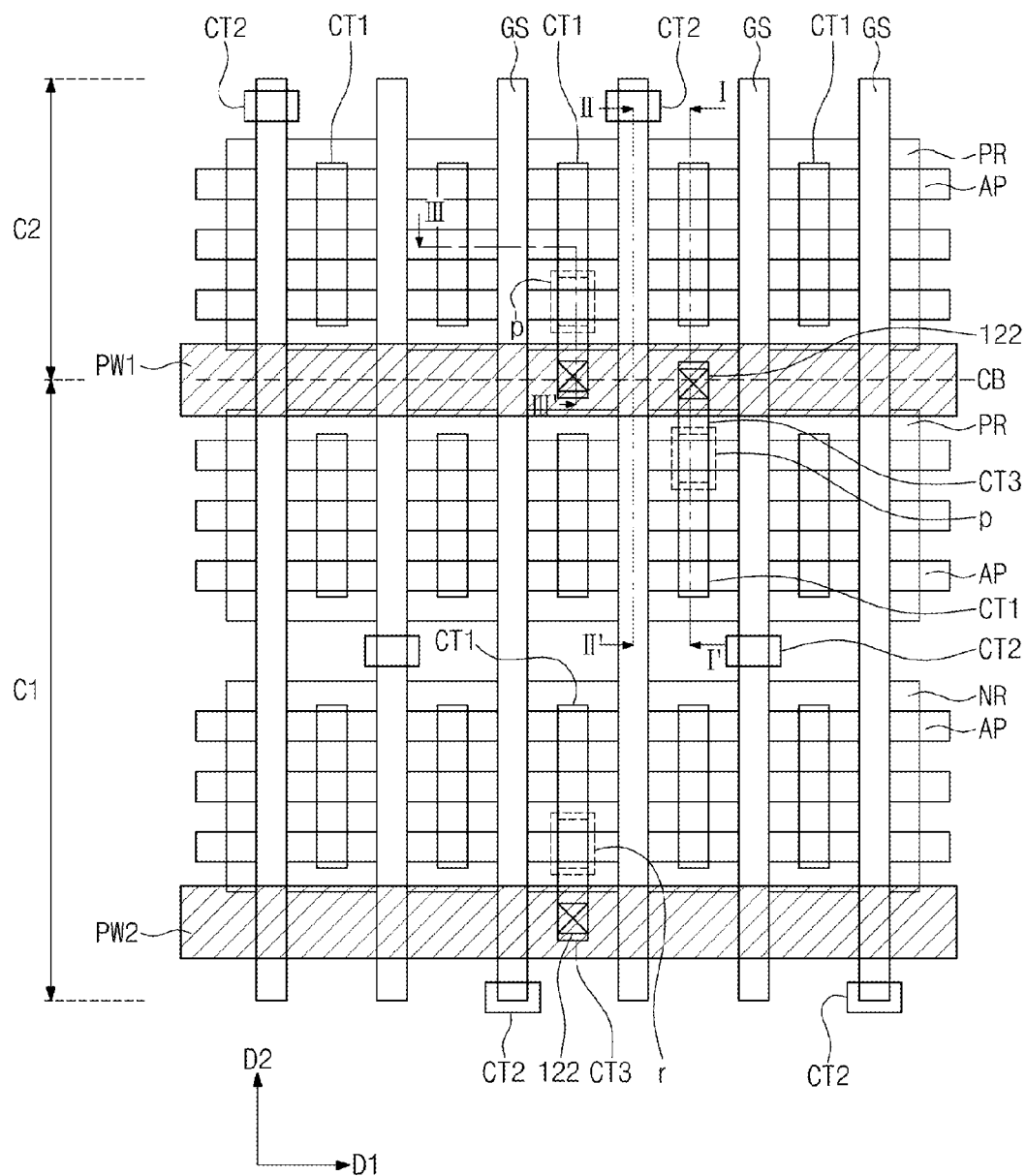
Figure 10B:
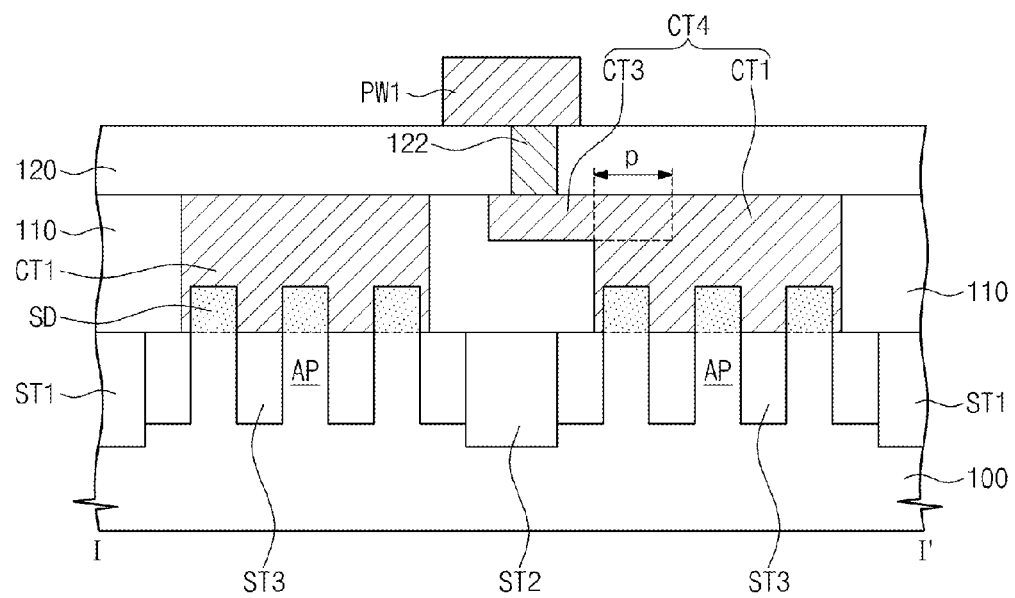
Figure 10C:
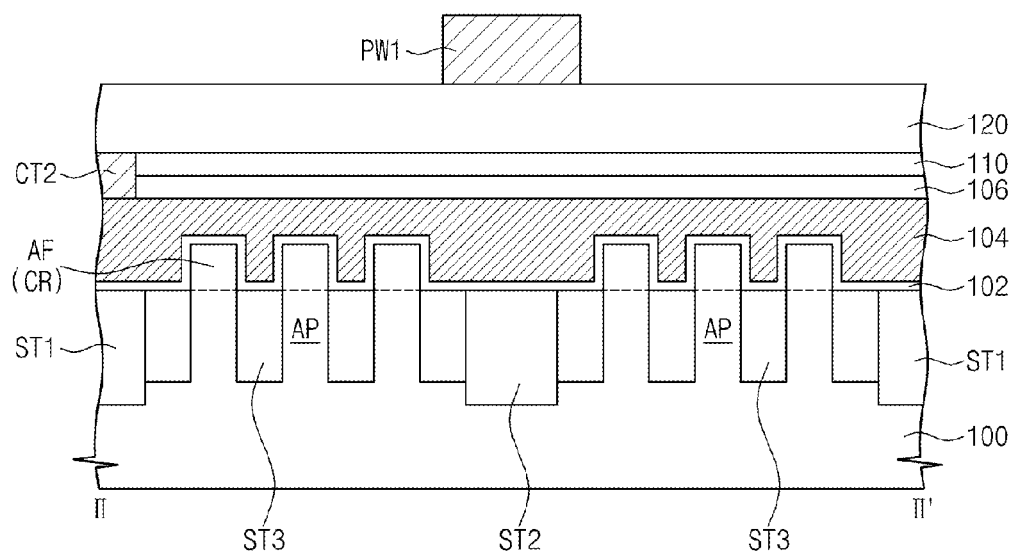
Figure 10D:
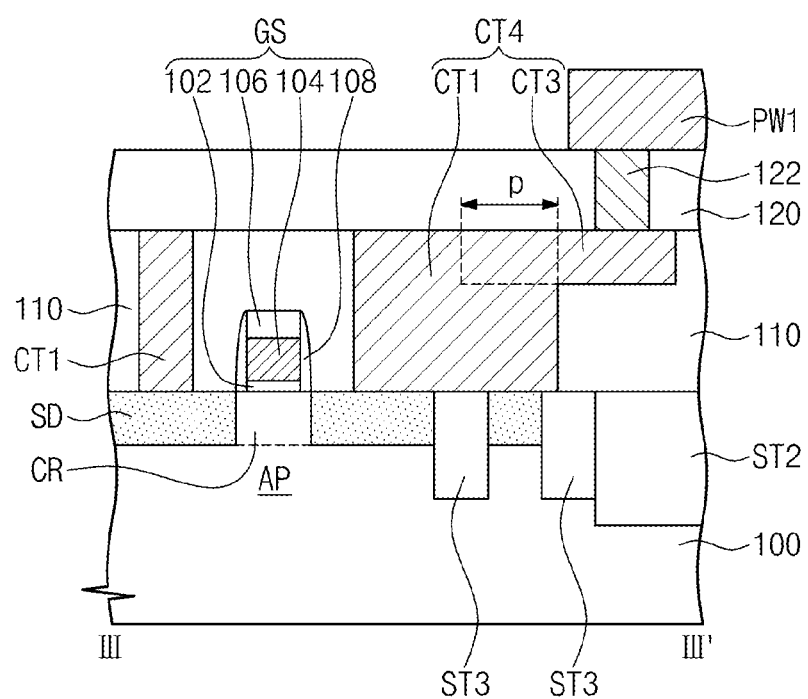
Figure 11A:
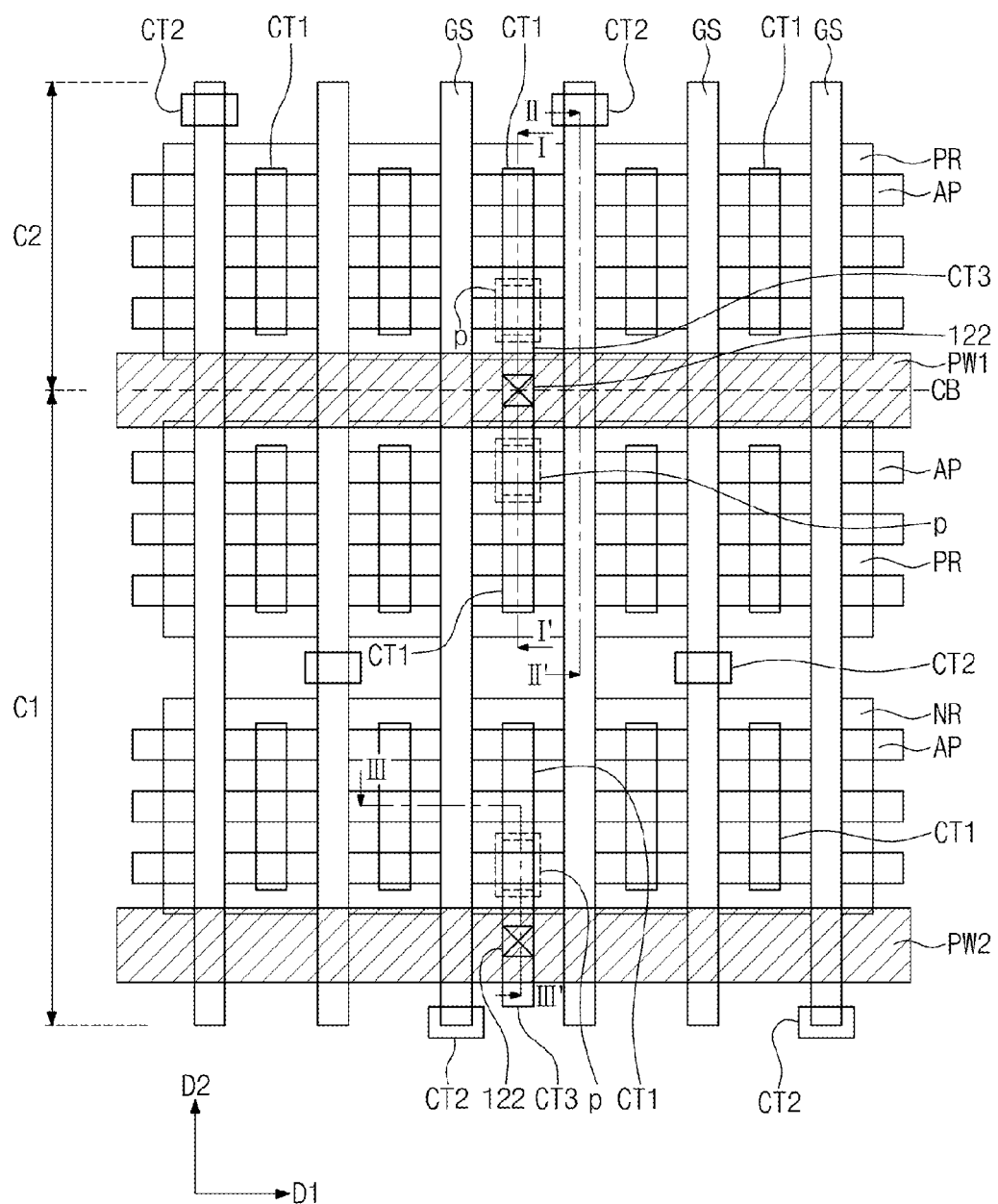
Figure 11B:
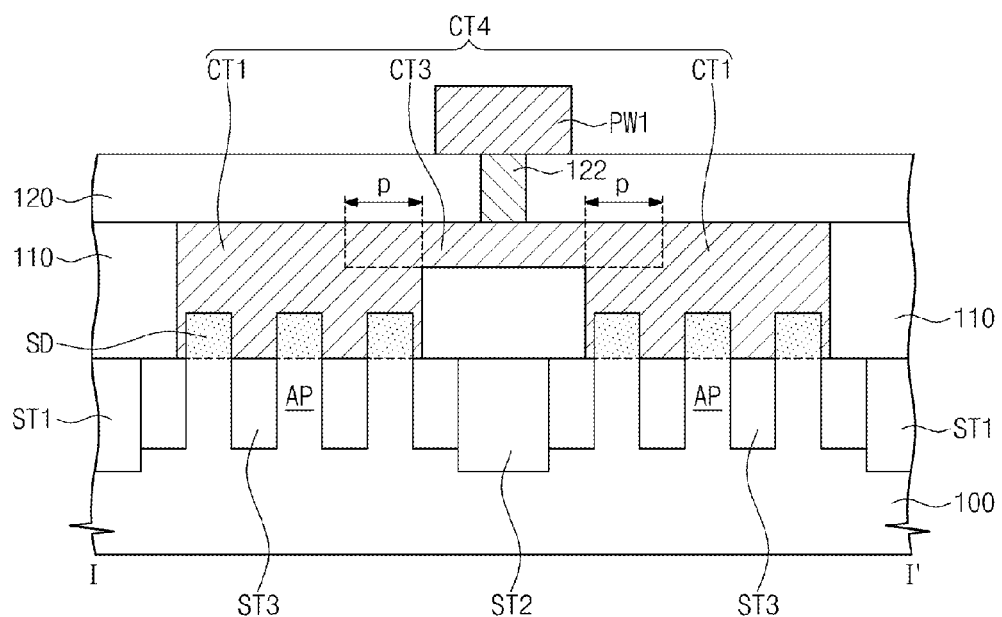
Figure 11C:
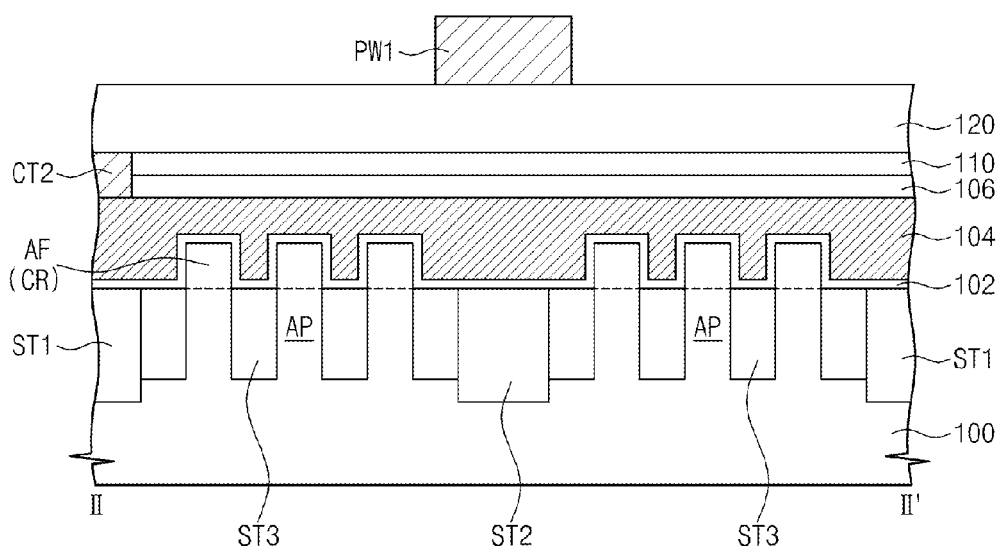
Figure 11D:
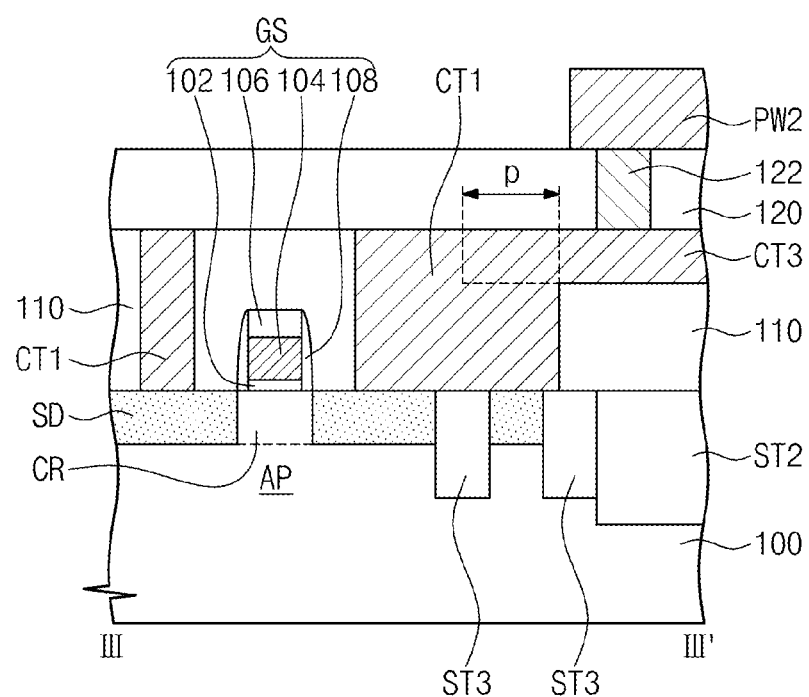
Figure 12A:
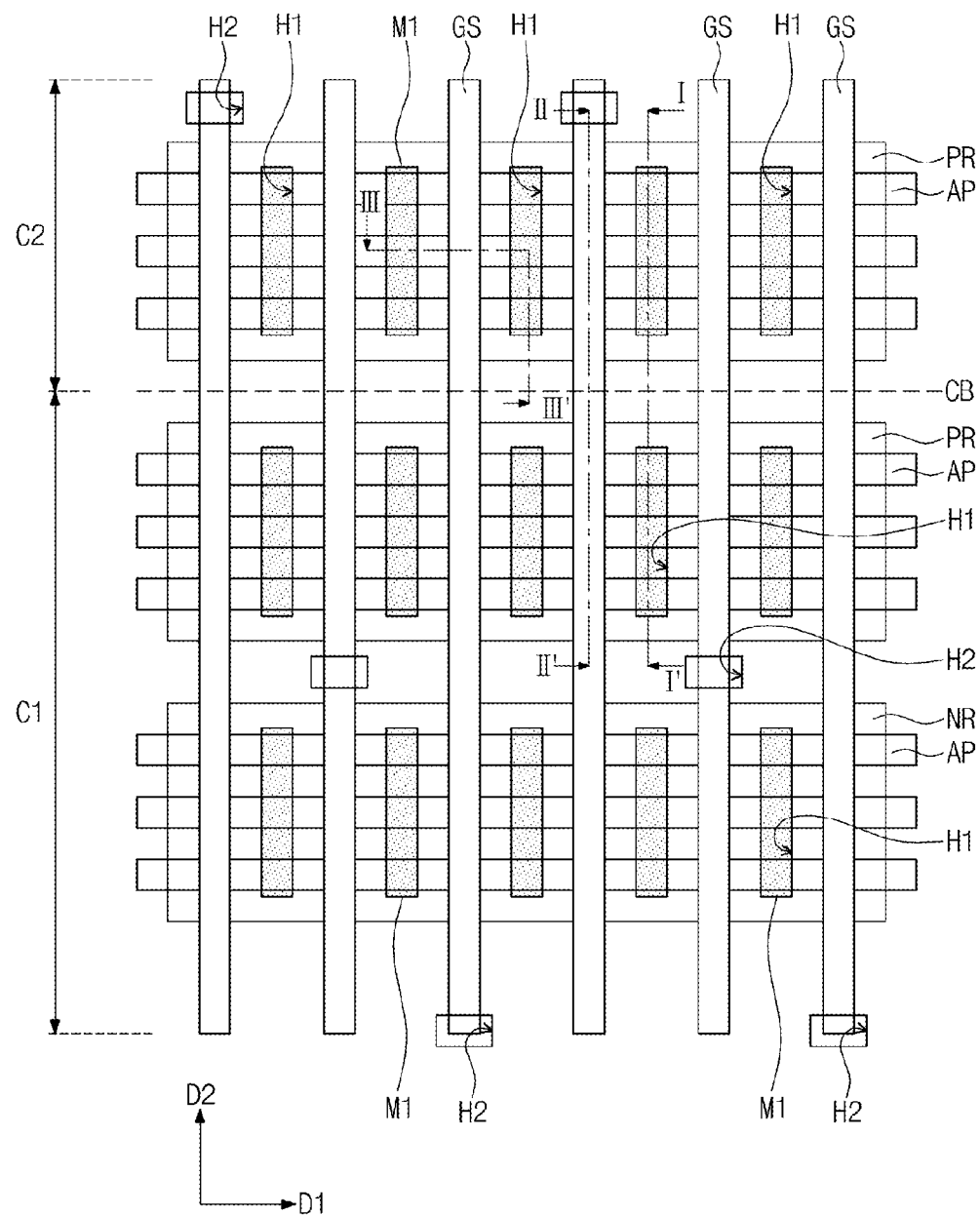
Figure 12B:
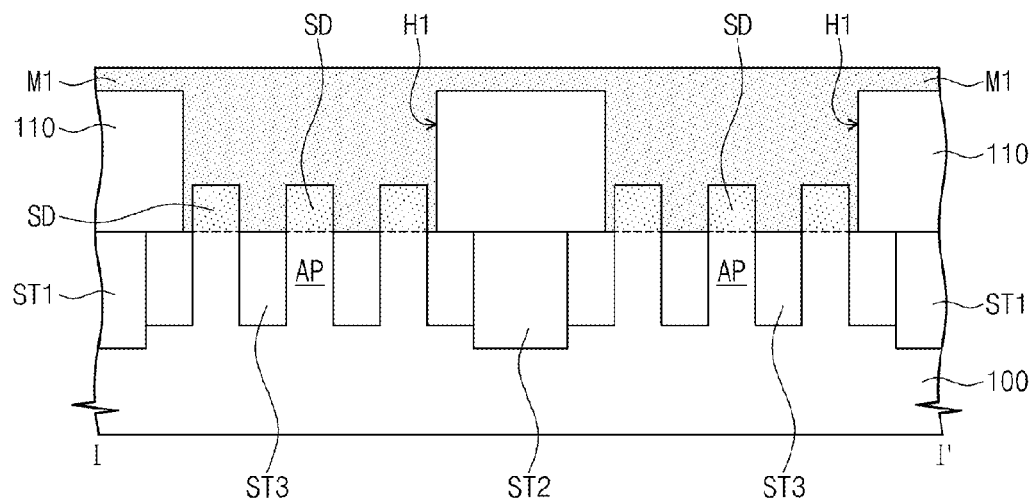
FIGS. 12B, 13B and 14B are cross-sectional views taken along lines I-I' of FIGS. 12A through 14A, respectively.
Figure 12C:
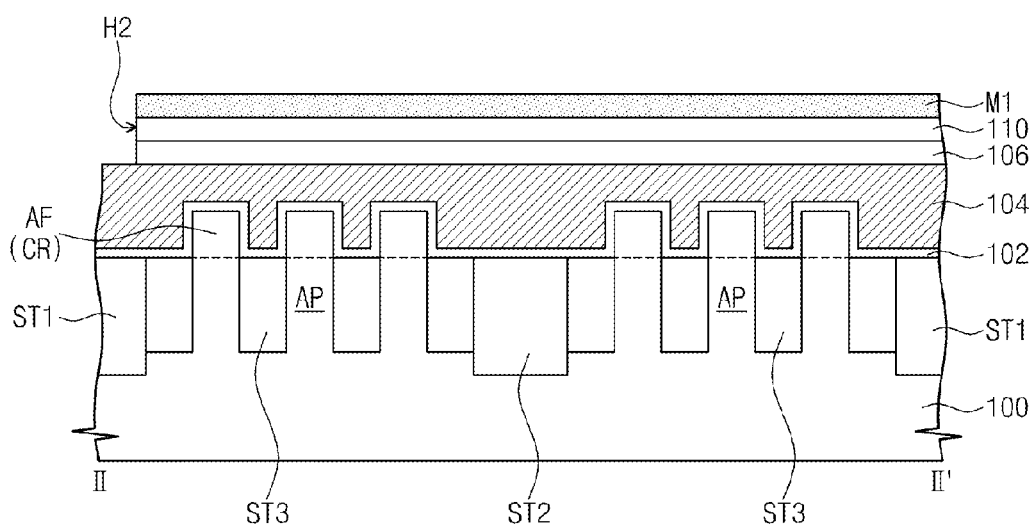
FIGS. 12C, 13C and 14C are cross-sectional views taken along lines II-II' of FIGS. 12A through 14A, respectively.
Figure 12D:
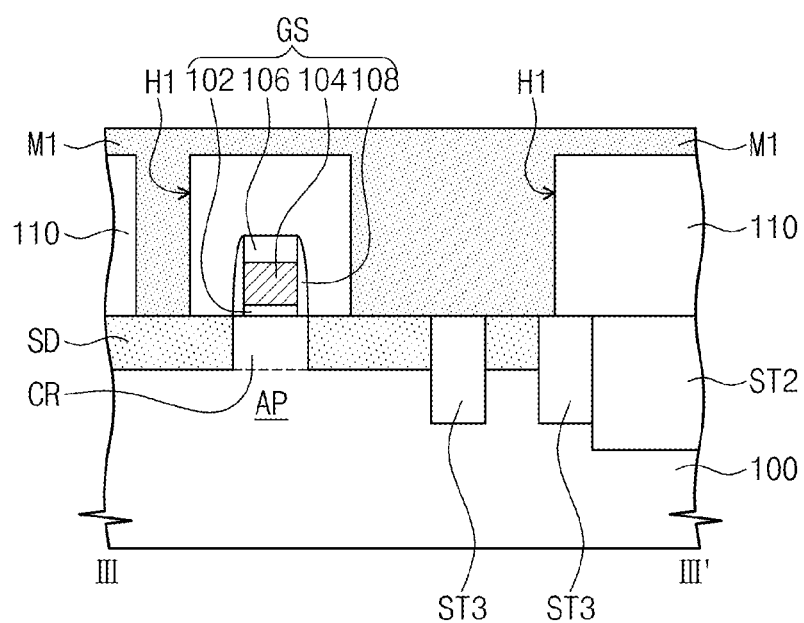
Figure 13A:
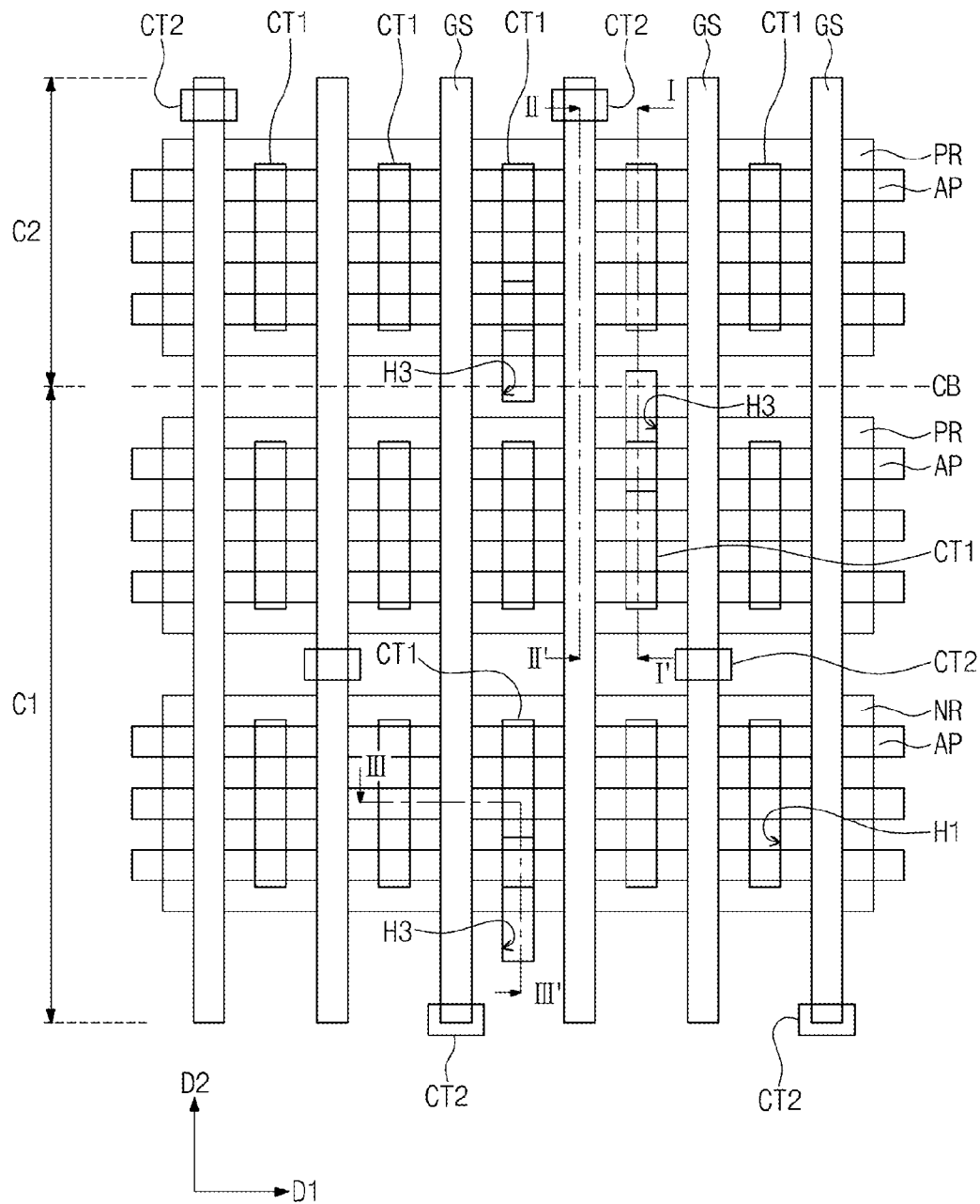
Figure 13B:
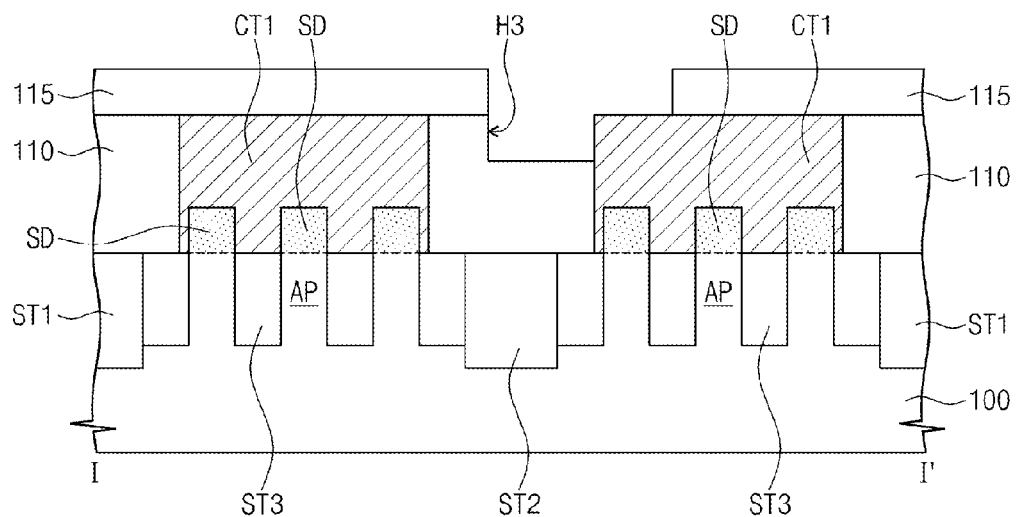
Figure 13C:
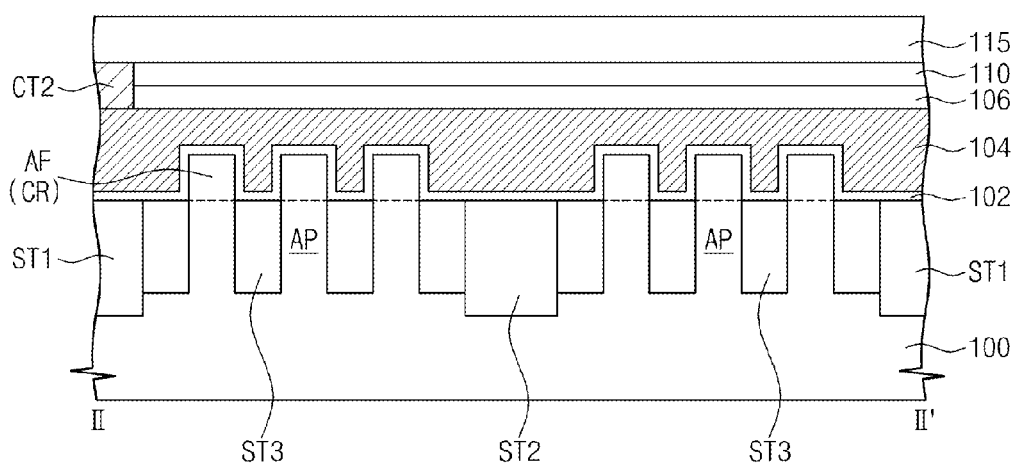
Figure 13D:
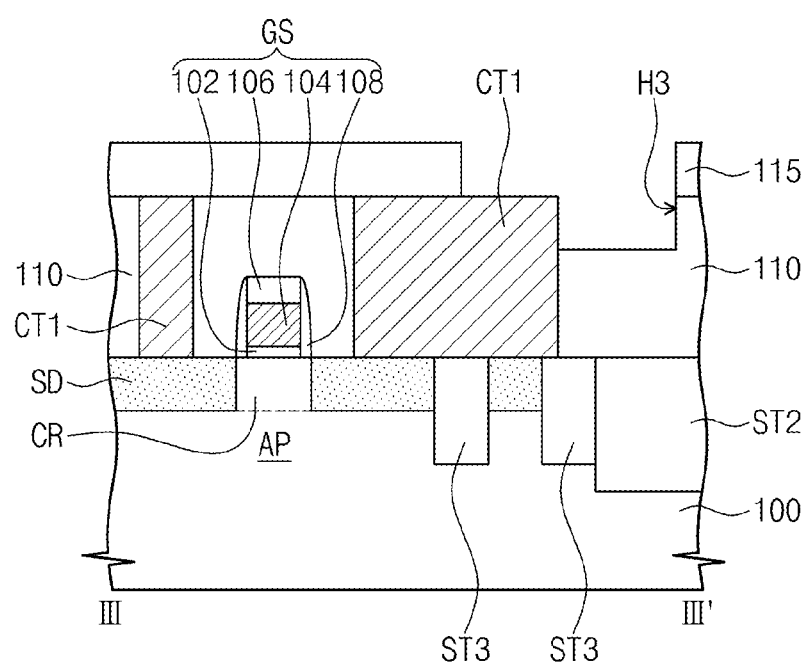

A first common conductive line PW1 that overlaps the PMOSFET region PR and a second common conductive line PW2 that overlaps the NMOSFET region NR may be formed on the second interlayer insulating layer 120. When viewed from above, i.e., in plan, the first and second common conductive lines PW1 and PW2 may extend in the first direction D1 and may be spaced apart from each other in the second direction D2. The third contact CT3 may be connected to one of the first and second common conductive lines PW1 and PW2 through the via 122. As illustrated in FIG. 7A, a third contact CT3 may be provided on the PMOSFET region PR to be connected to the first common conductive line PW1, and a third contact CT3 may be provided on the PMOSFET region PR to be connected to the first common conductive line PW1 may be provided on the NMOSFET region NR to be connected to the second common conductive line PW2. In the case in which the third contact CT3 is connected to the first common conductive line PW1, the first common conductive line PW1 may apply a drain voltage Vdd, that is, a power voltage to the source/drain region SD of each of the logic cells C1 and C2 adjacent to each other through the via 122, the third contact CT3, and the connection contact CT4. In the case in which the third contact CT3 is connected to the second common conductive line PW2, the second common conductive line PW2 may apply a source voltage Vss, that is, a ground voltage to the source/drain region SD of each of the logic cells C1 and C2 adjacent to each other through the via 122, the third contact CT3, and the connection contact CT4.

Although not illustrated in the drawings, conductive lines electrically connected to the first contacts CT1, which are not connected to the third contact CT3, and the second contacts CT2 may be formed on the substrate 100. Some of the conductive lines may apply a voltage to the source/drain regions SD through the first contacts CT1 which are not connected to the third contact CT3. Others of the conductive lines may apply a gate voltage to the gate structures GS through the second contacts CT2.

Figure 20:
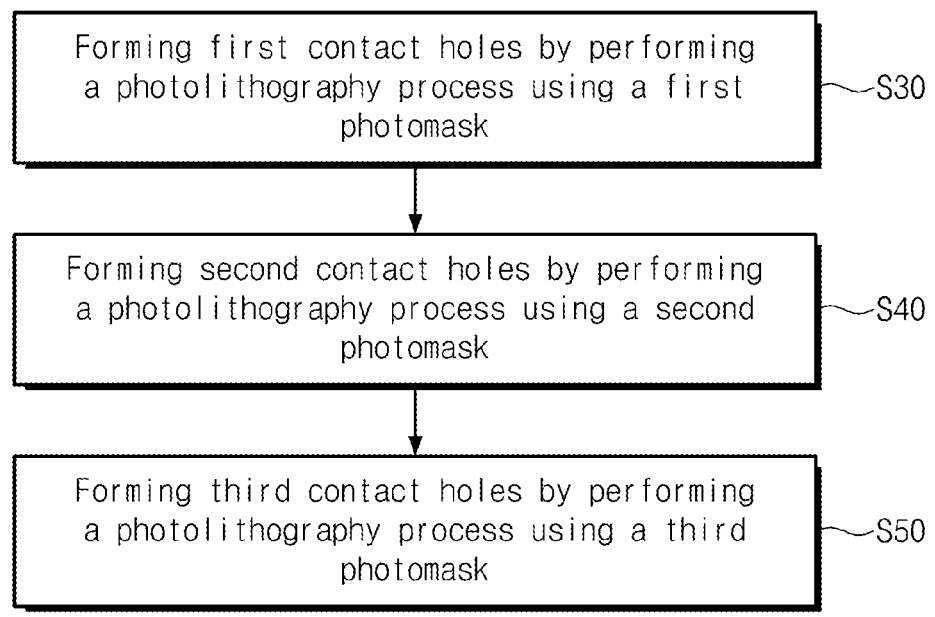
FIG. 20 is a flowchart illustrating a method of forming first through third contact holes in accordance with other embodiments according to the inventive concept.

FIGS. 8A through 10D show a method of manufacturing a semiconductor device in accordance with a second embodiment of the inventive concept. Features/aspects of this embodiment common to the first embodiment of FIGS. 2A through 6D may not be described again to avoid redundancy. FIG. 20 is a flowchart illustrating a method of forming first through third contact holes in accordance with other embodiments according to the inventive concept.

As described with reference to FIGS. 2A through 2D and 3A through 3D, a device isolation layer ST may be formed on the substrate 100 to define an active region and active patterns AP, and gate structures GS, source/drain regions SD, a first interlayer insulating layer 110 covering the gate structures GS, and first contact holes H1 penetrating the first interlayer insulating layer 110 on both sides of each gate structure GS may be formed. The first contact holes H1 may be formed by a photolithography process using a first photomask (S30 of FIG. 20). The first contact holes H1 may be formed using the same method as that described with reference to FIGS. 3A through 3D.

Referring to FIGS. 1 and 8A through 8D, a first mask layer M1 filling the first contact holes H1 may be formed on the first interlayer insulating layer 110. The first mask layer M1 may be, for example, a SOH layer.

Second contact holes H2 are formed through the first mask layer M1 and the first interlayer insulating layer 110. Each of the second contact holes H2 may expose the gate electrode 104 of each of the gate structures GS. The second contact holes H2 may be formed by an exposure process (i.e. photolithography process) using a second photomask (S40 of FIG. 20). Forming the second contact holes H2 may include forming a photoresist layer on the first mask layer M1, forming a photoresist pattern having openings defining regions in which the second contact holes H2 will be formed by performing an exposure process using the second photomask on the photoresist layer, etching the first mask layer M1 and the first interlayer insulating layer 110 exposed by the openings, and removing the photoresist pattern.

After that, a second mask layer M2 filling the second contact holes H2 may be formed on the first mask layer M1. The second mask layer M2 may be an SOH layer.

A third contact hole H3 is formed through the second mask layer M2, and in a portion of the first mask layer M1, and a portion of the first interlayer insulating layer 110. The third contact hole H3 may include an overlap region (r) in which the third contact hole H3 overlaps a region formerly occupied by the first contact hole H1. The third contact hole H3 may be formed at a side of at least one of the gate structures GS. According to an example of this embodiment of the inventive concept, the third contact hole H3 does not expose any of the source/drain regions SD. A plurality of such third contact holes H3 may be formed.

The third contact hole H3 may be formed by an exposure process using a third photomask (S50 of FIG. 20). Forming the third contact holes H3 may include forming a photoresist layer on the second mask layer M2, forming a photoresist pattern having openings defining regions in which the third contact holes H3 will be formed by performing an exposure process using the third photomask on the photoresist layer, etching the second mask layer M2, the first mask layer M1, and the first interlayer insulating layer 110 exposed by the openings, and removing the photoresist pattern.

According to this embodiment of the inventive concept, the third contact hole H3 may be formed using a photomask different from that used to form the first contact holes H1 and the second contact holes H2.

Referring to FIGS. 9A through 9D, the second mask layer M2 and the first mask layer M1 may be removed. Accordingly, the resulting distance or spacing in the second direction D2 between one of the third contact hole H3 open to one of the adjacent first contact holes H1 and the other or the contact holes H1 may be smaller than the minimum pitch which can be achieved by an exposure process. The first and second mask layers M1 and M2 may be removed using an ashing process and/or a strip process. As the first and second mask layers M1 and M2 are removed, a single connection hole H4 constituted by the third contact hole H3 and the first contact hole H1 open to the third contact hole H3 may be formed in the first interlayer insulating layer 110. The connection hole H4 may include an overlap region (r) in which the third contact hole H3 and the first contact hole H1 coincide or overlap. A conductive layer CL filling the contact holes H1, H2 and H3 may be formed on the first interlayer insulating layer 110.

Referring to FIGS. 1 and 10A through 10D, the conductive layer CL may be planarized until the first interlayer insulating layer 110 is exposed. Accordingly, first contacts CT1, second contacts CT2, and a third contact CT3 may be formed in the first contact holes H1, the second contact holes H2, and the third contact hole H3, respectively. The third contact CT3 may be connected to one of the first contacts CT1. In the case in which a plurality of the third contact CT3 are formed, the third contacts CT3 may be connected to corresponding ones of the first contacts CT1, respectively. A connection contact CT4 may be constituted by the third contact CT3 and the first contact CT1 connected to the third contact CT3. The connection contact CT4 may include an overlap portions (p) in which the third contact CT3 and the first contact CT1 connected thereto in essence overlap. By the planarization process, top surfaces of the first contacts CT1, top surfaces of the second contacts CT2, and a top surface of the third contact CT3 may be located at the same level in the device. Accordingly, a top surface of the connection contact CT4 may be substantially coplanar with a top surface of the first interlayer insulating layer 110.

Processes, substantially the same as the manufacturing processes described with reference to FIGS. 6A through 6D, may be subsequently performed.

FIGS. 11A through 11D illustrate a modified example of the method of manufacturing a semiconductor device in accordance with the second embodiment of the inventive concept. The description of common features will be omitted to avoid redundancy.

As shown in and described with reference to FIGS. 2A through 2D and 3A through 3D, a first interlayer insulating layer 110 covering the active patterns AP and the gate structures GS may be formed on the substrate 100. The gate structures GS may cross the active patterns AP. First contact holes H1 penetrating the first interlayer insulating layer 110 may be formed on both sides of each gate structure GS. The first contact holes H1 may be formed by an exposure process using a first photomask.

Then, processes similar to those shown in and described with reference to FIGS. 8A through 8D are performed. However, in this example, the third contact hole H3 is formed through the second mask layer M2, a portion of the first mask layer M1, and a portion of the first interlayer insulating layer 110 extending to regions where the first contact holes H1 immediately adjacent to each other in the second direction D2 are filled by the first mask layer M1. The third contact hole H3 may be formed to extend in the second direction D2 into those portions of the first mask layer M1 filling the adjacent first contact holes H1. Accordingly, the third contact hole H3 may include overlap regions (r) coinciding with regions at which the first contact holes H1 were provided, respectively.

The third contact hole H3 may be formed using a photomask different from that used to form the first contact holes H1 and the second contact holes H2. The third contact hole H3 may be formed by an exposure process using a third photomask.

Referring to FIGS. 11A through 11D, the first and second mask layers M1 and M2 may be removed. The first and second mask layers M1 and M2 may be removed by performing an ashing process and/or a strip process. A conductive layer CL filling the contact holes H1, H2 and H3 may be formed on the first interlayer insulating layer 110 and the conductive layer CL may be planarized until the first interlayer insulating layer 110 is exposed. Accordingly, first contacts CT1, second contacts H2, and a third contact CT3 may be formed in the first contact holes H1, the second contact holes H2, and the third contact hole H3, respectively.

According to this example of the inventive concept, the third contact CT3 is connected to the pair of the first contacts CT1 immediately adjacent to each other in the second direction D2. A connection contact CT4 is constituted by the third contact CT3 and the pair of the first contacts CT1 connected to the third contact CT3. The connection contact CT4 may include the overlap portions (p) shown in FIG. 11B. By the planarization process, top surfaces of the first contacts CT1, top surfaces of the second contacts CT2, and a top surface of the third contact CT3 may be located at the same level in the device. Accordingly, a top surface of the connection contact CT4 may be substantially coplanar with a top surface of the first interlayer insulating layer 110.

Processes that are similar to the manufacturing processes described with reference to FIGS. 6A through 6D are subsequently performed.

FIGS. 12A through 14D illustrate a method of manufacturing a semiconductor device in accordance with a third embodiment of the inventive concept.

As described with reference to FIGS. 2A through 2D and 3A through 3D, a device isolation layer ST may be formed on the substrate 100 to define an active region. The active region may include a PMOSFET region PR and an NMOSFET region NR separated by the device isolation layer ST. The device isolation layer ST may include a first device isolation layer ST1 delimiting the PMOSFET region PR and the NMOSFET region NR, a second device isolation layer ST2 separating the first logic cell C1 from the adjacent logic cells C2, C3 and C4, and a third device isolation layer ST3 defining active patterns AP in the PMOSFET region PR and the NMOSFET region NR. The third device isolation layer ST3 may extend in the first direction D1. Accordingly, the active patterns AP may extend in the first direction D1 and may be spaced apart from one another in the second direction D2. Each active pattern AP may have an upper region (an active fin AF) exposed by the third device isolation layer ST3.

Gate structures GS crossing the active patterns AP and extending in the second direction D2 may be formed on the substrate 100. The gate structures GS may be spaced apart from one another in the first direction D1. Each of the gate structures GS may include a gate insulating pattern 102, a gate electrode 104, and a capping pattern 106 that are sequentially stacked on the substrate 100. Each of the gate structures GS may further include a gate spacer 108 formed on both sidewalls of the gate electrode 104.

Source/drain regions SD may be formed by performing an ion implantation process on a resultant structure in which the gate structures GS are formed. The source/drain regions SD may be formed in or at the active patterns AP on both sides of each gate structure GS. Parts of the active patterns AP located under each gate structure GS may be used as a channel region CR.

A first interlayer insulating layer 110 covering the gate structures GS may be formed on the substrate 100. First contact holes H1 may be formed through the first interlayer insulating layer 110 on both sides of each gate structure GS. The first contact holes H1 may be formed by an exposure process (i.e. photolithography process) using a first photomask (S30 of FIG. 20). The first contact holes H1 may be formed using the same method as that described with reference to FIGS. 3A through 3D.

Referring to FIGS. 1 and 12A through 12D, a first mask layer M1 filling the first contact holes H1 may be formed on the first interlayer insulating layer 110. The first mask layer M1 may be an SOH layer.

Second contact holes H2 may be formed through the first mask layer M1 and the first interlayer insulating layer 110 to expose the gate electrode 104 of each of the gate structures GS. The second contact holes H2 may be formed by an exposure process using a second photomask (S40 of FIG. 20). The forming of the second contact holes H2 may include forming a photoresist layer on the first mask layer M1, forming a photoresist pattern having openings defining regions in which the second contact holes H2 will be formed by performing an exposure process using the second photomask on the photoresist layer, etching the first mask layer M1 and the first interlayer insulating layer 110 exposed by the openings, and removing the photoresist pattern.

Referring to FIGS. 13A through 13D, the first mask layer M1 may then be removed. The first mask layer M1 may be removed by performing an ashing process and/or a strip process. A conductive layer filling the first and second contact holes H1 and H2 may be formed on the first interlayer insulating layer 110 and the conductive layer may be planarized until the first interlayer insulating layer 110 is exposed. Accordingly, first contacts CT1 and second contacts H2 may be formed in the first contact holes H1 and the second contact holes H2, respectively. By the planarization process, top surfaces of the first and second contacts CT1 and CT2 and a top surface of the first interlayer insulating layer 110 may be located at the same level in the device.

After the first contacts CT1 and the second contacts CT2 are formed, an insulating layer 115 may be formed on the first interlayer insulating layer 110. The insulating layer 115 may cover top surfaces of the first contacts CT1 and the second contacts CT2. The insulating layer 115 may include at least one of a silicon oxide layer and a silicon oxynitride layer.

According to this embodiment of the inventive concept, a third contact hole H3 may be formed through the insulating layer 115 and a portion of the first interlayer insulating layer 110 to expose at least a portion of one of the first contacts CT1. The third contact hole H3 may be formed at a side of at least one of the gate structures GS. A plurality of the third contact hole H3 may be formed, in which case the third contact holes H3 may expose corresponding ones of the first contacts CT1, respectively.

The third contact hole H3 may be formed by performing an exposure process using a third photomask (S50 of FIG. 20). For example, the third contact hole H3 may be formed by forming a photoresist layer on the interlayer insulating layer 115, forming a photoresist pattern having openings defining a region in which the third contact hole H3 will be formed by performing an exposure process using the third photomask on the photoresist layer, etching the interlayer insulating layer 115 and the first interlayer insulating layer 110 exposed by the openings, and removing the photoresist pattern. During the etching process, at least a portion of one of the first contacts CT1 may be exposed. According to an example of this embodiment, and although not illustrated, the first contact CT1 exposed by the third contact hole H3 may be recessed by the etching process.

The third contact hole H3 may be formed using a photomask different from that used to form the first contact holes H1 and the second contact holes H2. That is, the third contact hole H3 exposing one of the first contacts CT1 filling the first contact holes H1 immediately adjacent to each other in the second direction D2 may be formed using a photomask different from that which was used to form the first contact holes H1. Accordingly, the distance that can be provided between the contacts formed in the third contact hole H3 and the first contact holes H1 (described in more detail below) is not constrained by the resolution limit of an exposure process.

Referring to FIGS. 14A through 14D, a conductive layer filling the third contact hole H3 may be formed on the insulating layer 115. The conductive layer may be planarized until the insulating layer 115 is exposed. Accordingly, a third contact CT3 filling the third contact hole H3 may be formed. By the planarization process, a top surface of the third contact hole H3 and a top surface of the insulating layer 115 may be located at the same level in the device.

The third contact CT3 may be connected to one of the first contacts CT1. In the case in which a plurality of the third contact CT3 is provided, the third contacts CT3 may be connected to corresponding ones of the first contacts CT1, respectively. A connection contact CT4 may be constituted by the third contact CT3 and the first contact CT1 connected thereto.

According to some embodiments of the inventive concept, a top surface CT3($u$) of the third contact CT3 may be higher than a top surface CT1($u$) of the first contact CT1. In addition, a bottom surface CT3(L) of the third contact CT3 may be lower than the top surface CT1(u) of the first contact CT1.

Subsequently, processes similar to those shown in described with reference to FIGS. 6A through 6D may be performed.

Another example of the third embodiment of the inventive concept is shown in FIGS. 15A through 15D. The description of features and aspects of the method common to those shown in and described with reference to FIGS. 2A through 3D and FIGS. 12A through 14D will be omitted to avoid redundancy.

As described with reference to FIGS. 2A through 2D and 3A through 3D, a first interlayer insulating layer 110 covering active patterns AP and gate structures GS may be formed on a substrate 100. The gate structures GS may cross the active patterns AP. First contact holes H1 may be formed through the first interlayer insulating layer 110 on both sides of each of the gate structures GS. The first contact holes H1 may be formed by a photolithography process using a first photomask (S30 of FIG. 20).

Referring back to FIGS. 12A through 12D, a first mask layer M1 filling the first contact holes H1 may be formed on the first interlayer insulating layer 110. Second contact holes H2 may be formed through the first mask layer M1 and the first interlayer insulating layer 110 to expose the gate electrode 104 of each of the gate structures GS. The second contact holes H2 may be formed by a photolithography process using a second photomask (S40 of FIG. 20).

Referring back to FIGS. 13A through 13D, the first mask layer M1 may be removed. After that, a conductive layer filling the first and second contact holes H1 and H2 may be formed on the first interlayer insulating layer 110 and may be planarized until the first interlayer insulating layer 110 is exposed. Accordingly, first contacts CT1 and second contacts CT2 may be formed in the first contact holes H1 and the second contact holes H2, respectively. After the first contact holes H1 and the second contact holes H2 are formed, an insulating layer 115 may be formed on the first interlayer insulating layer 110.

According to this example of the inventive concept, a third contact hole H3 may be formed through the insulating layer 115 and at least a portion of the first interlayer insulating layer 110, to expose the pair of the first contacts CT1 immediately adjacent to each other in the second direction D2. The third contact hole H3 may be formed on a side of at least one of the gate structures GS to expose at least a portion of each of the pair of the first contacts CT1. The third contact hole H3 may extend further than illustrated in the second direction D2 to expose even more of the first contacts CT1.

The third contact hole H3 may be formed using a photomask different from that used to form the first contact holes H1 and the second contact holes H2. That is, the third contact hole H3 may be formed by a photolithography process using a third photomask (S50 of FIG. 20). The third contact hole H3 may be formed using the same method as that described with reference to FIGS. 13A through 13D.

Referring to FIGS. 15A through 15D, a conductive layer filling the third contact hole H3 may be formed on the insulating layer 115 and may be planarized until the insulating layer 115 is exposed. Accordingly, a third contact CT3 filling the third contact hole H3 may be formed. By the planarization process, a top surface of the third contact CT3 and a top surface of the insulating layer 115 may be located at the same level in the device.

The third contact CT3 may be connected to the pair of the first contacts CT1 immediately adjacent to each other in the second direction D2. A connection contact CT4 may be constituted by the third contact CT3 and the pair of the first contacts CT1 connected thereto.

Figure 14A:
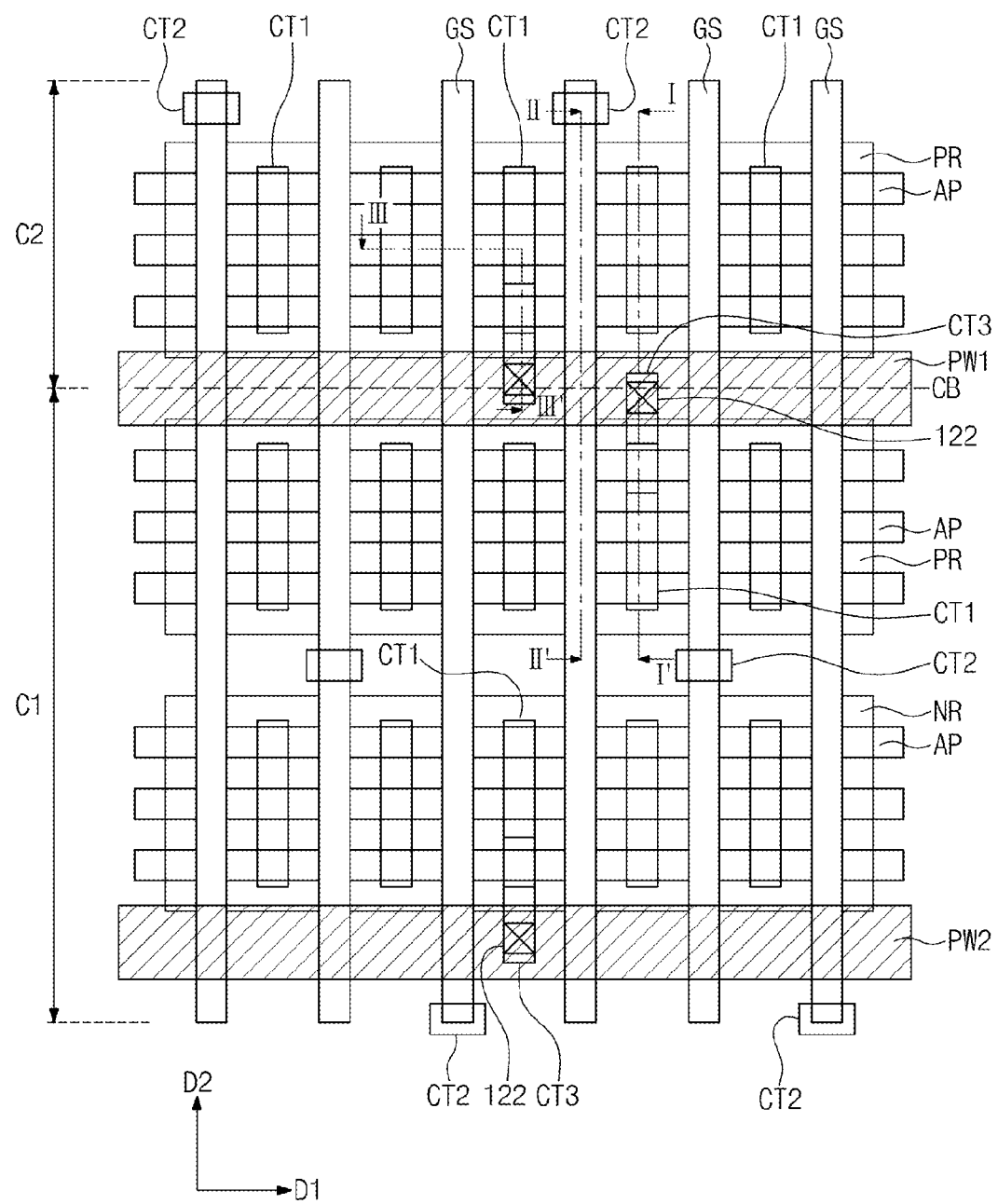
Figure 14B:
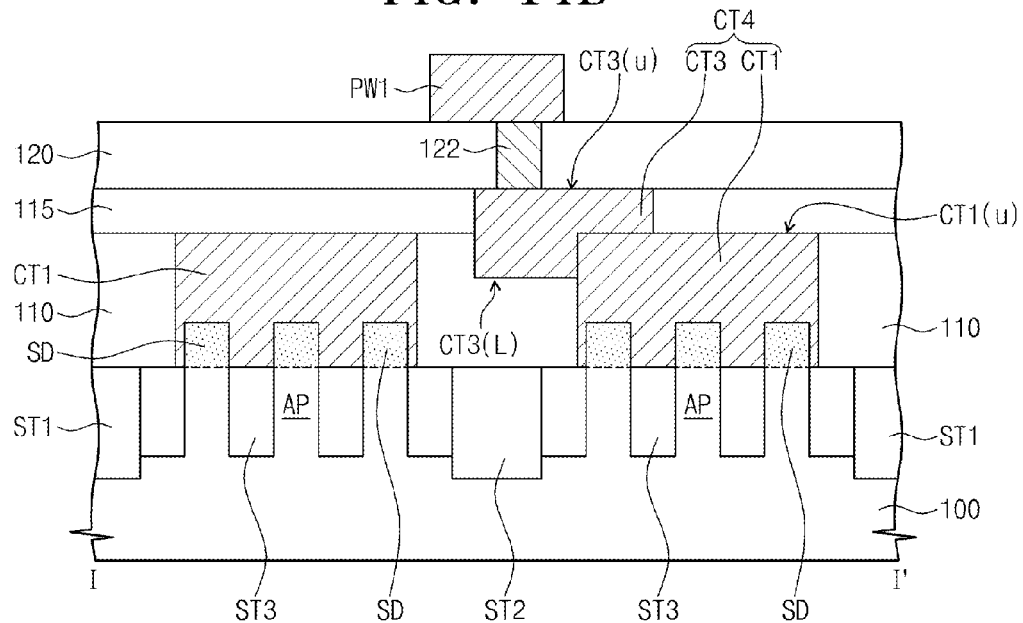
Figure 14C:
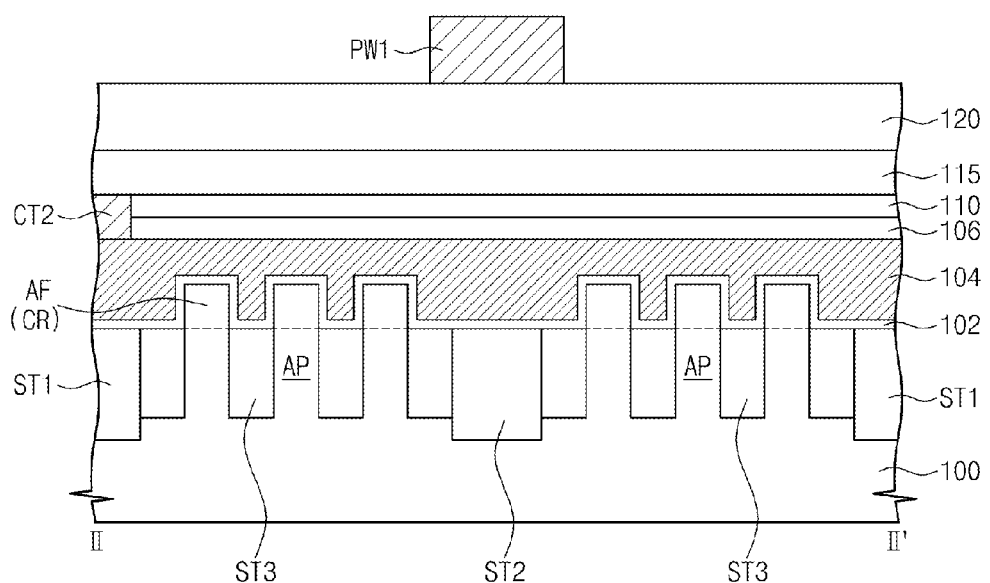
Figure 14D:
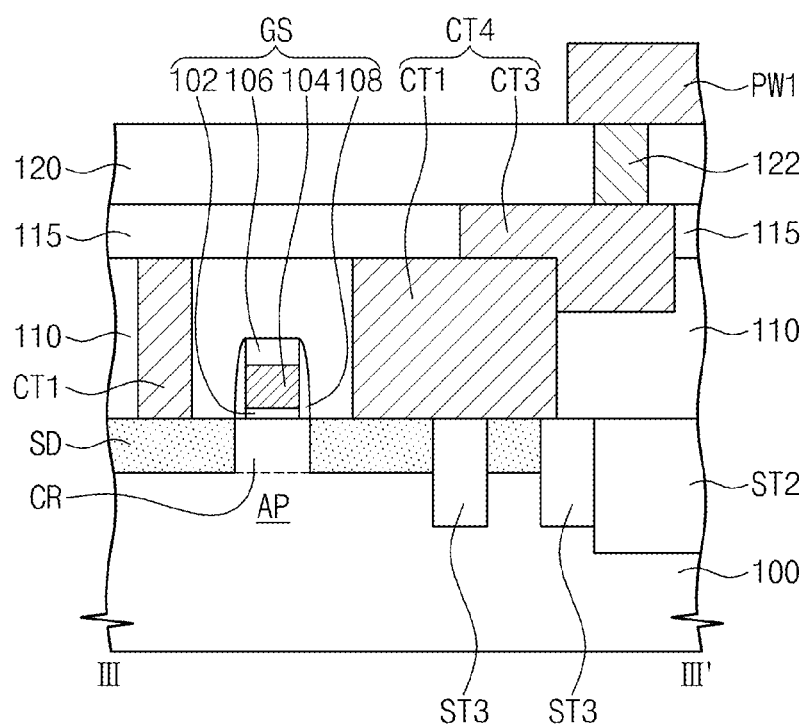
Figure 15A:
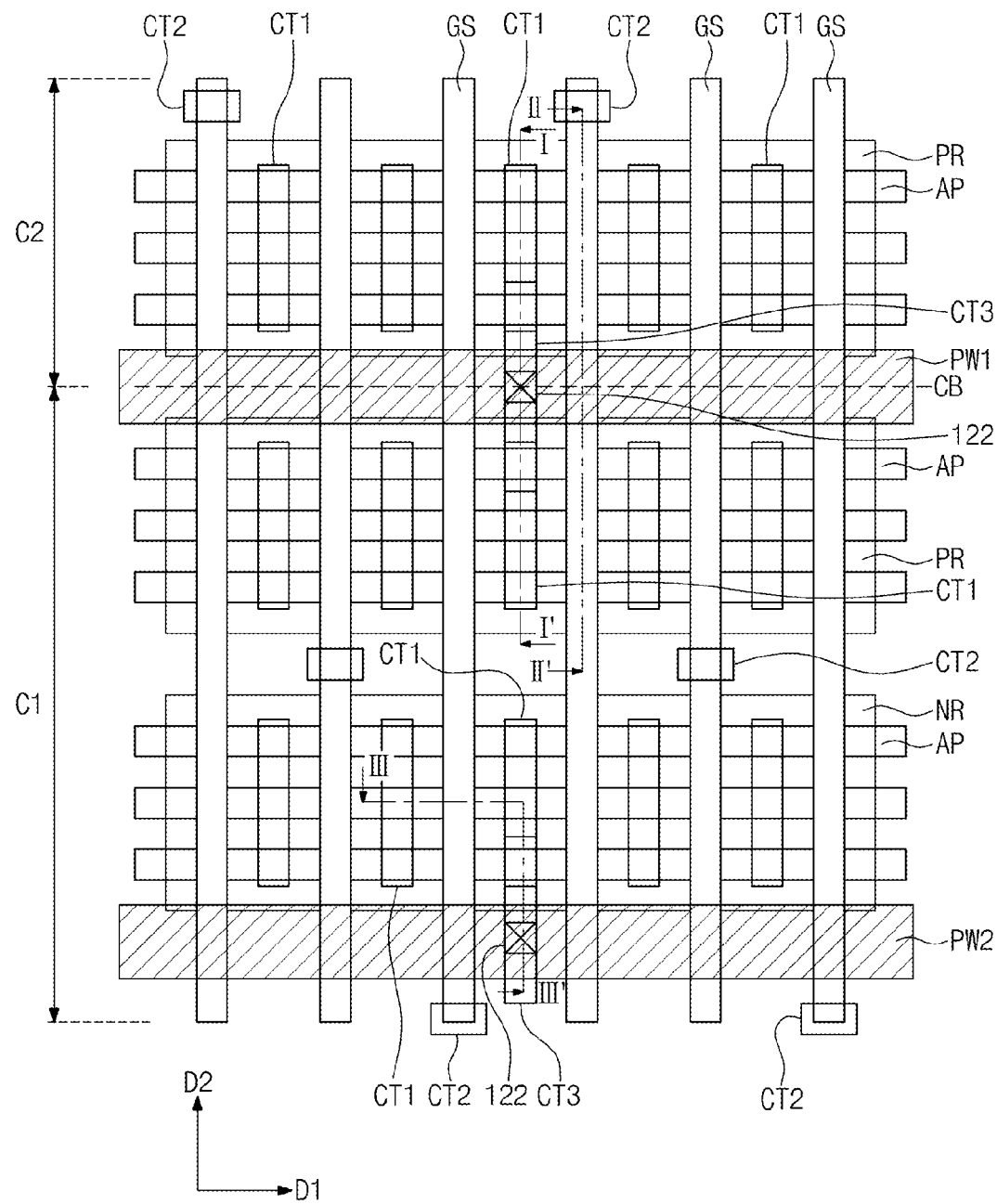
Figure 15B:
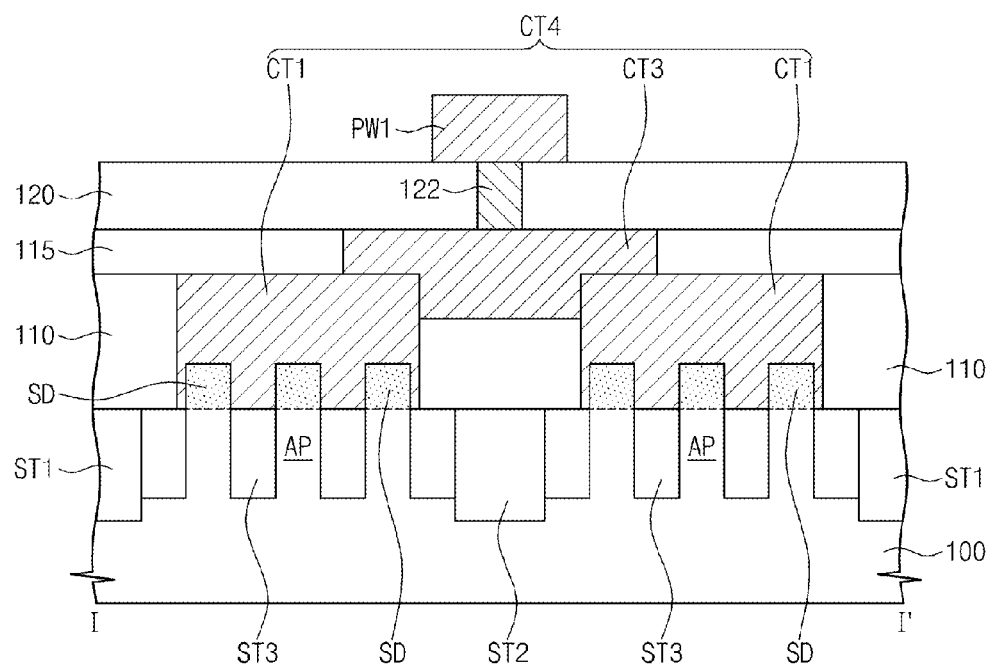
Figure 15C:
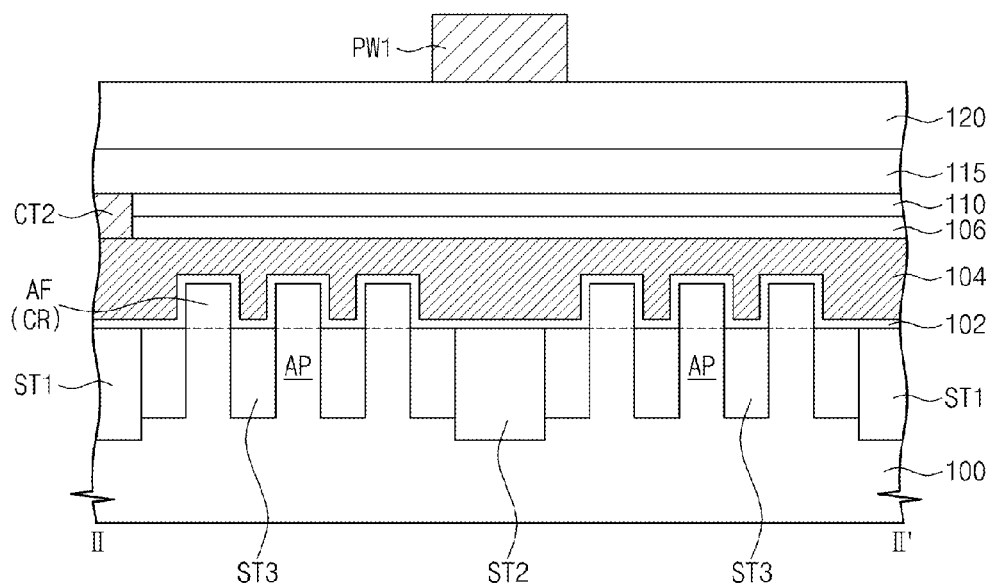
Figure 15D:
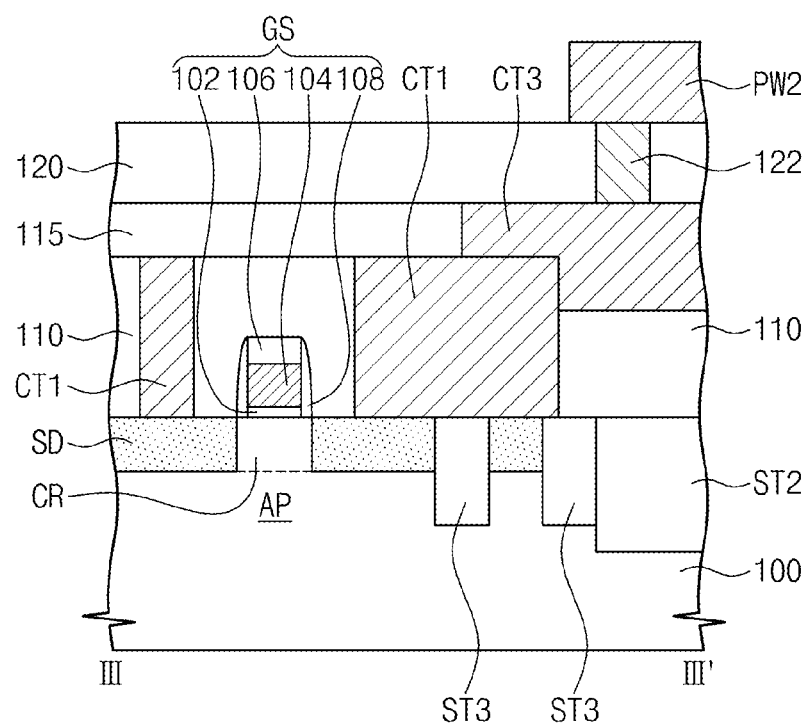

Similar to the features illustrated in FIG. 14B, a top surface of the third contact CT3 may be higher than a top surface of the first contact CT1. In addition, a bottom surface of the third contact CT3 may be lower than the top surface of the first contact CT1.

Processes similar to those shown in and described with reference to FIGS. 6A through 6D are subsequently performed.

According to the inventive concept, the third contact hole H3 disposed between the pair of the first contact holes H1, immediately adjacent to each other in the second direction D2, may be formed using a photomask different from that used to form the pair of the first contact holes H1. Accordingly, the distance that may be provided between contacts adjacent each other in the second direction D2, and formed in the pair of first contact holes H1 and the third contact hole H3, is not constrained by a resolution limit of an exposure process of a photolithography process.

In addition, in the case in which the third contact CT3 connected to at least one of the pair of the first contacts CT1 is formed between the pair of the first contacts CT1 immediately adjacent to each other in the second direction D2, at least one of the pair of the first contacts CT1 may be connected to the first common conductive line PW1 or the second common conductive line PW2 through the third contact CT3 and the via 122. Because the third contact CT3 is formed using a photomask different from that used to form the pair of the first contacts CT1, the via 122 may be freely disposed on the third contact CT3 without being limited by the minimum pitch between the first contacts CT1. The disposition of the common conductive lines PW1 and PW2 is also not be limited by the minimum pitch between the first contacts CT1.

Thus, a semiconductor device may be provided easily manufactured by performing a method according to the inventive concept.

Figure 16:
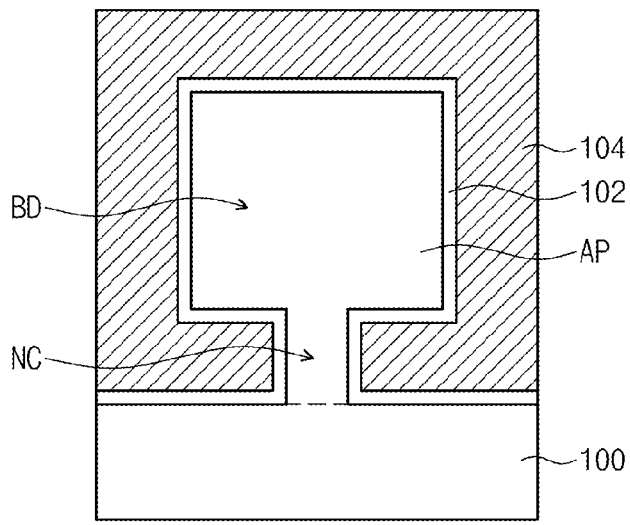
FIG. 16 is a cross-sectional view of another example of an active pattern of a semiconductor device made in accordance with embodiments of the inventive concept.
Figure 17:
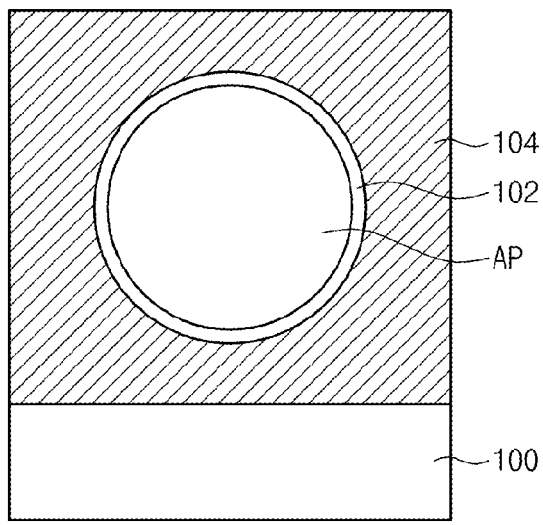
FIG. 17 is a cross-sectional view of still another example of an active pattern of a semiconductor device made in accordance with embodiments of the inventive concept.

FIGS. 16 and 17 illustrate other types of active patterns AP, i.e., types other than fins, which can be formed in methods according to the inventive concept.

Referring to FIG. 16, the cross section of the active pattern AP may be generally T-shaped including a neck part NC adjacent to a substrate 100 and a body part BD wider than the neck part NC. A gate insulating pattern 102 and a gate electrode 104 may be sequentially provided on the active pattern AP. A part of the gate electrode 104 may extend below the body part BD of the active pattern AP.

Referring to FIG. 17, the active pattern AP of the semiconductor device may have the form of a nano-wire spaced apart from a substrate 100. A gate insulating pattern 102 and a gate electrode 104 may be sequentially provided on the active pattern AP. The gate electrode 104 may thus extend between the active pattern AP and the substrate 100.

Figure 18:
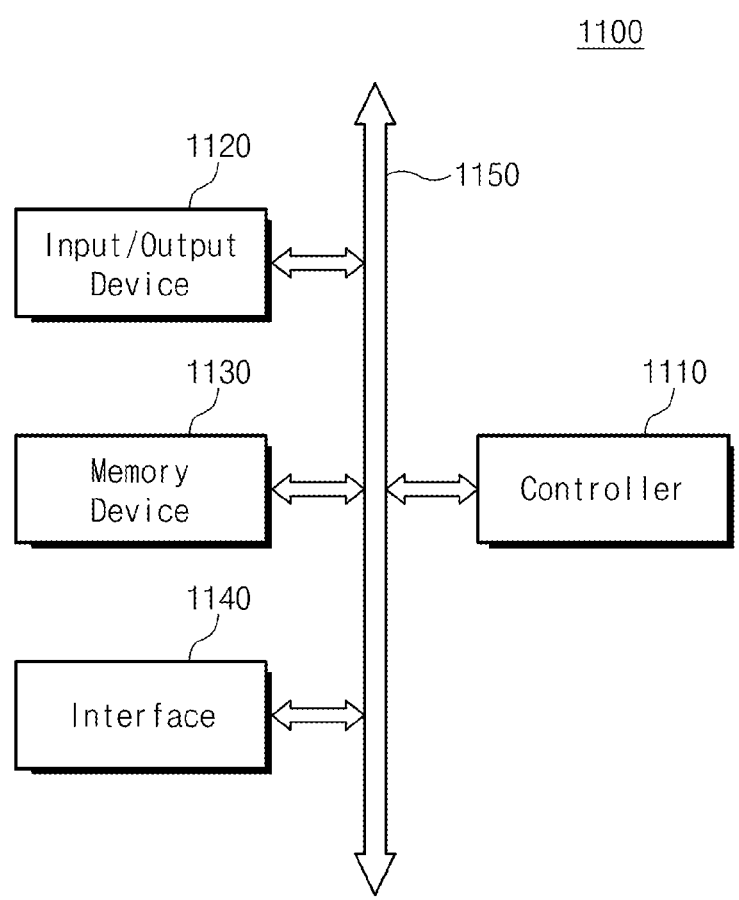
FIG. 18 is a block diagram of an electronic system including a semiconductor device in accordance with embodiments of the inventive concept.

FIG. 18 is a block diagram of an electronic system including a semiconductor device in accordance with embodiments of the inventive concept.

Referring to FIG. 18, the electronic system 1100 may include a controller 1110, an input/output device 1120, a memory device 1130, an interface 1140 and a bus 1150. The controller 1110, the input/output device 1120, the memory device 1130 and/or the interface 1140 can communicate with one another through the bus 1150. The bus 150 is a path along which data moves.

The controller 1110 may include at least one of a microprocessor, a digital signal process, a micro controller and the like. The input/output device 1120 may include a keypad, a keyboard and a display device. The memory device 1130 can store data and/or commands. The interface 140 can perform a function of transmitting data to a communications network or receiving data from a communications network. The interface 1140 may have a wired or wireless form. For instance, the interface 1140 may include an antenna or a wired/wireless transceiver. Although not illustrated, the electronic system 1100 may further include a high speed DRAM and/or SRAM as an operation memory for improving an operation of the controller 1110. A semiconductor device in accordance with the inventive concept may be provided in the memory device 1130 or may be provided as a part of the controller 1110 and the input/output device 1120.

The electronic system 1100 may be that of a personal digital assistant (PDA), a portable computer, a web tablet, a wireless phone, a mobile phone, a digital music player, a memory card or, for that matter, basically any type of electronic device that can transmit and/or receive data in a wireless environment.

According to an aspect of the inventive concept, as described above, a third contact hole is formed to expose at least one of a pair of first contacts occupying first contact holes, immediately adjacent to each other in a given direction, using a photomask different from that used to form the pair of the first contact holes. Accordingly, the proximity that can be achieved between contacts in the given direction is not constrained by the resolution limit of a photolithographic exposure process.

In addition, at least one of the pair of the first contacts may be connected to a common conductive line through the third contact and a via. Because the third contact is formed using a photomask different from that used to form the pair of the first contacts, the via may be freely disposed on the third contact without being limited by the minimum pitch between the first contacts. The disposition of common conductive line is also not be limited by the minimum pitch between the first contacts.

Thus, an easy manufacturing method of a semiconductor device may be provided.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a semiconductor device, comprising: forming a plurality of active patterns extending along a first direction and spaced apart from each other along a second direction across the first direction, on a substrate; forming a gate electrode across extending along the second direction to cross the plurality of the active patterns; forming a first contact disposed at one side of the gate electrode and extending along the second direction to be electrically connected to the plurality of active patterns; forming a second contact connected to the gate electrode; and forming a third contact disposed at the side of the gate electrode and extending along the second direction from an end of the first contact, wherein the forming of the first contact comprises performing an exposure process using one photomask, the forming of the third contact comprises performing an exposure process using a photomask different from said one photomask, and wherein the third contact is formed such that a bottom surface of the third contact is disposed at a level in the device that is lower than that at which a top surface of the first contact is disposed.

2. The manufacturing method of claim 1, wherein the first and third contacts are formed such that a top surface of the third contact and the top surface of the first contact are located at the same level in the device.

3. The manufacturing method of claim 1, further comprising forming on the substrate a common conductive line electrically connected to the third contact, whereby the common conductive line can apply a voltage to the plurality of the plurality of the active patterns through the third contact and the first contact.

4. The manufacturing method of claim 3, further comprising forming a via on and electrically connected to the third contact, and
wherein the common conductive line is formed on the via as electrically thereto such that the via is interposed between the common conductive line and the third contact, and the third contact is electrically connected to the common conductive line through the via.

5. The manufacturing method of claim 1, wherein the first, second and third contacts are formed such that top surfaces thereof are located at the same level in the device.

6. The manufacturing method of claim 1, wherein the third contact is formed using the same photomask as that used to form the second contact.

7. The manufacturing method of claim 6, wherein the forming of the first, second and third contacts comprise: forming an interlayer insulating layer covering the plurality of the active patterns and the gate electrode on the substrate; performing a photolithography process using a first photomask to form a first contact hole through the interlayer insulating layer at the side of the gate electrode; and performing a photolithography process using a second photomask to concurrently form a second contact hole through the interlayer insulating layer to expose the gate electrode, and a third contact hole through the interlayer insulating layer at the side of the gate electrode, wherein the second contact hole is spaced apart from the first contact hole and the third contact hole extends from the first contact hole along the second direction, and the first through third contacts are formed in the first through third contact holes, respectively.

8. The manufacturing method of claim 7, wherein the forming of the first, second and third contacts comprise:
forming, on the interlayer insulating layer, a conductive layer filling the first, second and third contact holes; and
planarizing the conductive layer until a top surface of the interlayer insulating layer is exposed.

9. The manufacturing method of claim 1, wherein the second contact is formed using a photomask different from the photomask used to form the third contact.

10. The manufacturing method of claim 9, wherein the forming the first, second and third contacts comprise: forming an interlayer insulating layer covering the plurality of the active patterns and the gate electrode on the substrate; performing a photolithography process using a first photomask to form a first contact hole through the interlayer insulating layer at the side of the gate electrode; performing a photolithography process using a second photomask to form a second contact hole through the interlayer insulating layer to expose the gate electrode; and performing a photolithography process using a third photomask to form a third contact hole through the interlayer insulating layer at the side of the gate electrode, wherein the second contact hole is spaced apart from the first contact hole and the third contact hole extends from the first contact hole along the second direction, and the first, second and third contacts are formed in the first, second and third contact holes, respectively.

11. The manufacturing method of claim 10, wherein the forming of the first, second and third contacts comprise:
forming, on the interlayer insulating layer, a conductive layer filling the first through, second and contact holes; and
planarizing the conductive layer until a top surface of the interlayer insulating layer is exposed.

12. The manufacturing method of claim 9, wherein the forming of the first, second and third contacts comprise:
forming a first interlayer insulating layer covering the plurality of the active patterns and the gate electrode on the substrate; performing a photolithography process using a first photomask to form a first contact hole through the first interlayer insulating layer at the side of the gate electrode; performing a photolithography process using a second photomask to form a second contact hole through the first interlayer insulating layer to expose the gate electrode; forming the first contact and the second contact in the first contact hole and the second contact hole, respectively; forming, on the first interlayer insulating layer, a second interlayer insulating layer covering the first contact and the second contact; performing a photolithography process using a third photomask to form a third contact hole through at least a portion of the first interlayer insulating layer and the second interlayer insulating layer; and forming the third contact in the third contact hole, wherein the third contact hole exposes at least a portion of the first contact.

* * * * *